United States Patent
Yang

(10) Patent No.: US 10,474,027 B2
(45) Date of Patent: Nov. 12, 2019

(54) METHOD FOR FORMING AN ALIGNED MASK

(71) Applicant: MACRONIX INTERNATIONAL CO., LTD., Hsinchu (TW)

(72) Inventor: Chin-Cheng Yang, Gangshan Township (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 16 days.

(21) Appl. No.: 15/810,551

(22) Filed: Nov. 13, 2017

(65) Prior Publication Data
US 2019/0146330 A1   May 16, 2019

(51) Int. Cl.
*G03F 1/42* (2012.01)
*H01L 27/11521* (2017.01)
(Continued)

(52) U.S. Cl.
CPC .................. *G03F 1/42* (2013.01); *G03F 1/76* (2013.01); *G03F 1/80* (2013.01); *G03F 9/7073* (2013.01); *H01L 21/76816* (2013.01); *H01L 21/76877* (2013.01); *H01L 23/5226* (2013.01); *H01L 23/5283* (2013.01); *H01L 27/11521* (2013.01); *H01L 27/11526* (2013.01);
(Continued)

(58) Field of Classification Search
CPC .......... H01L 27/11573; H01L 23/5226; H01L 23/5283; H01L 21/76877; H01L 21/76816; H01L 27/11582; H01L 27/11568; H01L 27/11526; H01L 27/11556; H01L 27/11521; G03F 1/42; G03F 1/80; G03F 1/76
See application file for complete search history.

(56) References Cited

U.S. PATENT DOCUMENTS 6,201,274 B1 * 3/2001 Kanamori ....... H01L 21/823807
257/314
6,215,197 B1 * 4/2001 Iwamatsu ......... H01L 21/76229
257/797

(Continued)

FOREIGN PATENT DOCUMENTS

TW     278201 B     6/1996
TW     581993 B     4/2004
(Continued)

*Primary Examiner* — Victor A Mandala
(74) *Attorney, Agent, or Firm* — Haynes Beffel & Wolfield LLP

(57) ABSTRACT

A method for forming an aligned mask comprises etching a reference mark on a substrate to demarcate a boundary of an etch region; forming an etch mask on the substrate, using an exposure setting, the etch mask having a boundary; and measuring a distance between the reference mark and the boundary. When the measured distance is outside a margin of a target distance, then the etch mask is removed from the substrate, the exposure setting is changed, a next etch mask is formed using the changed exposure setting, and said measuring is repeated. A set of reference marks can be etched on a top level in a set of levels to demarcate boundaries of etch regions. An etch-trim process can be performed to form steps in the set of levels, wherein the etch-trim process includes at least first and second etch-trim cycles using first and second reference marks.

7 Claims, 24 Drawing Sheets

(51) Int. Cl.
    *H01L 27/11556*    (2017.01)
    *H01L 27/11526*    (2017.01)
    *H01L 27/11568*    (2017.01)
    *H01L 27/11582*    (2017.01)
    *G03F 1/76*    (2012.01)
    *H01L 21/768*    (2006.01)
    *H01L 23/528*    (2006.01)
    *H01L 23/522*    (2006.01)
    *G03F 1/80*    (2012.01)
    *H01L 27/11573*    (2017.01)
    *G03F 9/00*    (2006.01)
    *H01L 27/11548*    (2017.01)
    *H01L 27/11575*    (2017.01)

(52) U.S. Cl.
    CPC .. *H01L 27/11556* (2013.01); *H01L 27/11568* (2013.01); *H01L 27/11573* (2013.01); *H01L 27/11582* (2013.01); *H01L 27/11548* (2013.01); *H01L 27/11575* (2013.01)

(56) References Cited

U.S. PATENT DOCUMENTS

| | | | | |
|---|---|---|---|---|
| 6,660,612 | B1 * | 12/2003 | Chang | H01L 21/76229 257/E21.548 |
| 7,825,000 | B2 * | 11/2010 | Kanakasabapathy | H01L 23/544 257/422 |
| 2003/0224260 | A1 * | 12/2003 | Ning | G03F 7/70633 430/22 |
| 2004/0043579 | A1 * | 3/2004 | Nuetzel | H01L 23/544 438/401 |
| 2005/0101107 | A1 * | 5/2005 | Ohto | H01L 23/544 438/462 |
| 2007/0224706 | A1 * | 9/2007 | Izumi | H01L 27/11502 438/3 |
| 2009/0257033 | A1 | 10/2009 | Nara | |
| 2012/0061732 | A1 * | 3/2012 | Hirai | G11C 13/0007 257/211 |
| 2013/0328221 | A1 * | 12/2013 | Tsai | H01L 23/544 257/797 |
| 2015/0334845 | A1 * | 11/2015 | Niino | H01L 23/26 361/761 |
| 2016/0190151 | A1 | 6/2016 | Yang | |
| 2016/0248002 | A1 * | 8/2016 | Lu | H01L 43/02 |
| 2016/0359114 | A1 | 12/2016 | Nakamura | |
| 2017/0052447 | A1 | 2/2017 | Yamada | |
| 2019/0049849 | A1 * | 2/2019 | Chen | G03F 7/707 |

FOREIGN PATENT DOCUMENTS

| | | |
|---|---|---|
| TW | I439557 B | 6/2014 |
| TW | I532076 B | 5/2016 |
| WO | 2017169763 A1 | 10/2017 |

* cited by examiner

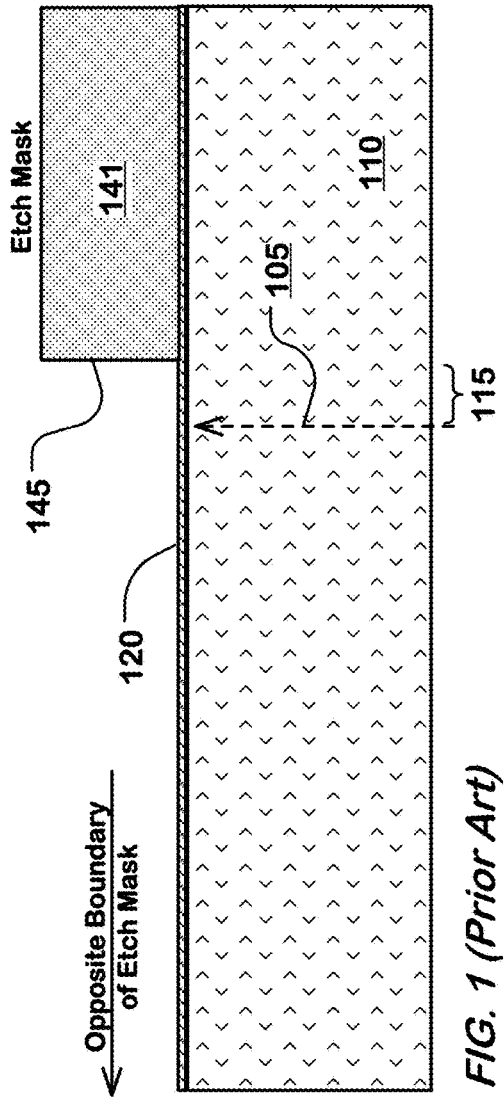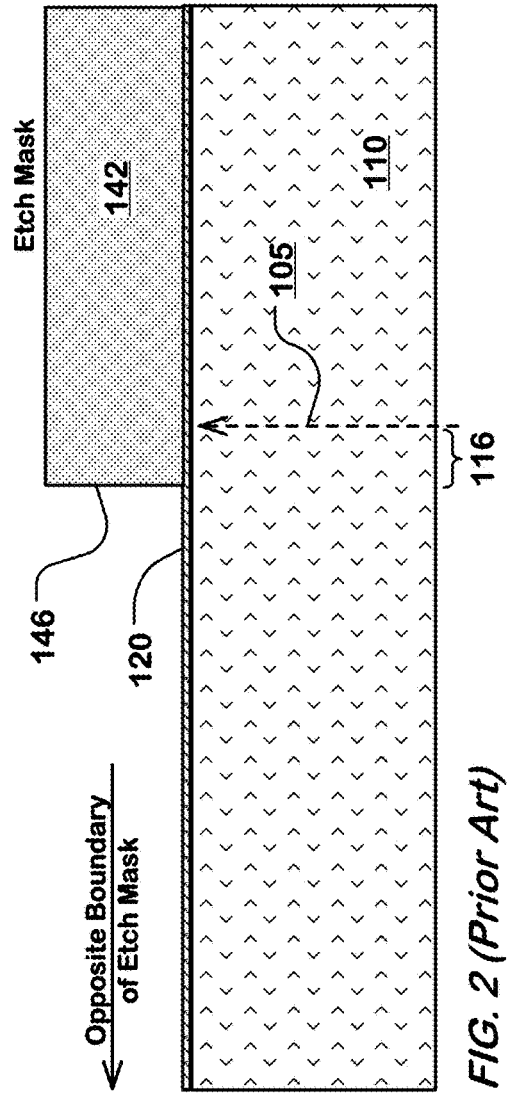

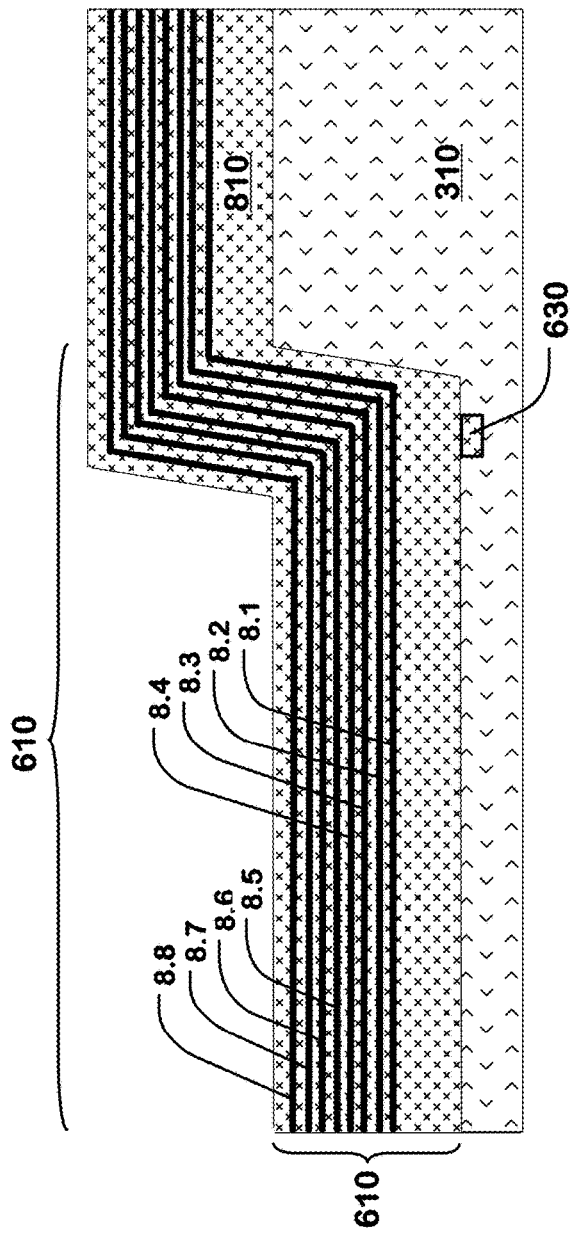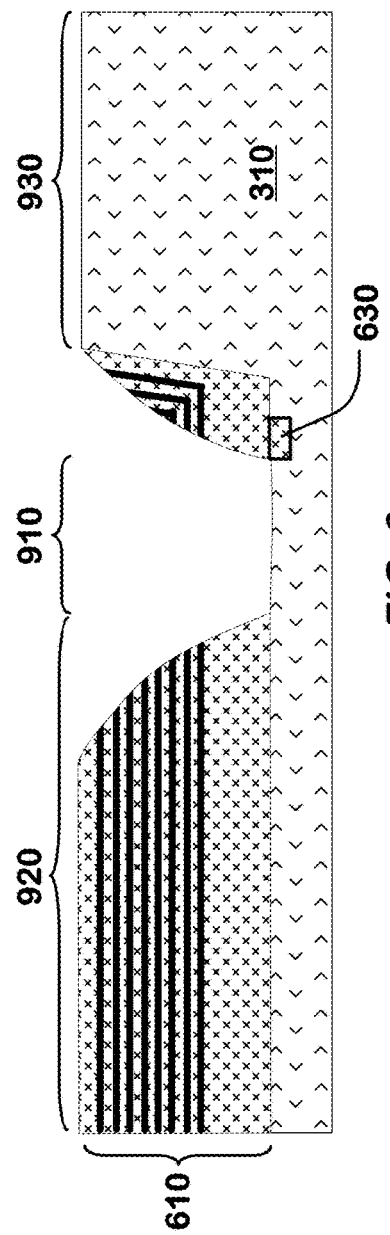
FIG. 8
FIG. 9

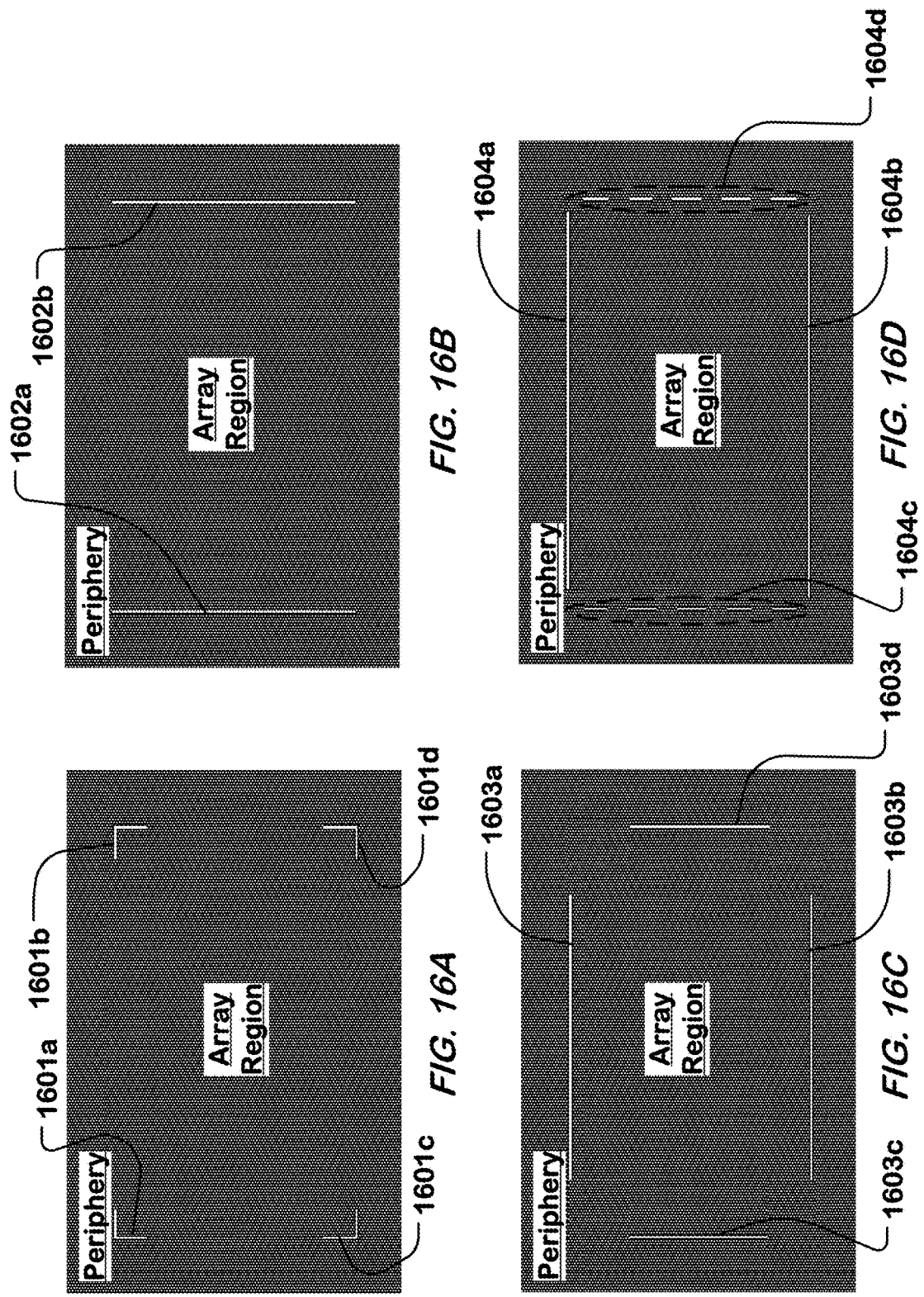

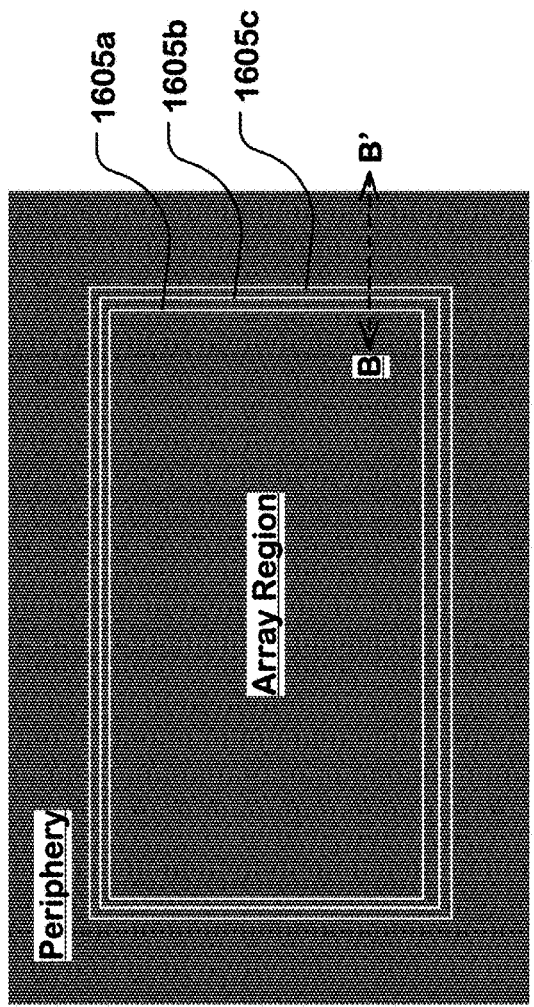
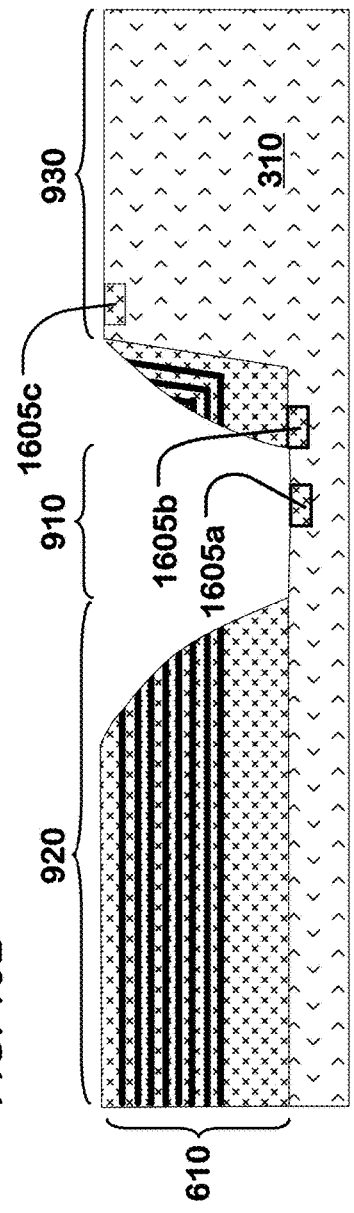
FIG. 16E
FIG. 16F

METHOD FOR FORMING AN ALIGNED MASK

BACKGROUND

Field of the Technology

The present technology relates generally to high density integrated circuit devices, and more particularly to methods for forming masks having large dimensions.

Description of Related Art

In the manufacturing of memory devices, forming etch masks that have large dimensions can be challenging. This is because an etch mask can have a dimension between two opposite boundaries that is so large that only one of the two opposite boundaries can be easily monitored inline at a time, for example, by using an inline SEM (scanning electronic microscope). In other words, two opposite boundaries of an etch mask cannot be easily monitored simultaneously due to the large dimension of the etch mask. Consequently it is difficult to directly measure inline a dimension of a large etch mask between two opposite boundaries, and then to adjust the etch mask accordingly. When such large dimensions must be measured, the manufacturer may need to remove the wafer from the manufacturing line and use specialized equipment.

It is desirable to provide a technology that can form an etch mask as specified that has a large dimension that may be difficult to measure inline.

SUMMARY OF THE DISCLOSURE

A method of forming an aligned mask is described. The method includes etching a reference mark on a substrate to demarcate a boundary of an etch region; forming an etch mask on the substrate, using an exposure setting, the etch mask having a boundary; and measuring a distance between the reference mark and the boundary of the etch mask. When the measured distance is outside a margin of a target distance, then the etch mask can be removed from the substrate, the exposure setting can be changed, a next etch mask can be formed using the changed exposure setting, and the measuring step can be repeated. When the measured distance is inside the margin, then the etch mask can be used in an etch process.

The exposure setting can include exposure energy and focus center calibrated to form the etch mask. The etch process can include etching a recess in the substrate using the etch mask, resulting in transferring the reference mark to a bottom of the recess. The etch process can include forming a memory array in the recess.

A device is described including a substrate comprising a recess extending into the substrate, and a reference mark on a bottom of the recess, a distance between the reference mark and a side of the recess being within a margin of a target distance. A target distance between a reference mark on a bottom of a recess and a side of the recess, and a target distance between a reference mark on an upper surface of a substrate and a boundary of an etch mask for etching the recess, can be different and have different values. A margin of a target distance between a reference mark on a bottom of a recess and a side of the recess, and a margin of a target distance between a reference mark on an upper surface of a substrate and a boundary of an etch mask for etching the recess, can be different and have different values. The differences can be due to a slope of the boundary of the etch mask, a slope of the side of the recess, or other factors. The reference mark can be disposed parallel to the side of the recess. A memory array can be disposed in the recess.

A method of forming a set of aligned masks is described. The method includes etching a set of reference marks on a top level in a set of levels on a substrate to demarcate boundaries of etch regions, and performing an etch-trim process to form steps at the levels in the set of levels, wherein the etch-trim process includes at least a first etch-trim cycle using a first reference mark in the set of reference marks and a second etch-trim cycle using a second reference mark in the set of reference marks.

The first etch-trim cycle can comprise forming a first etch-trim mask on the top level, using a first exposure setting, the first etch-trim mask having a first boundary; and measuring a first distance between the first reference mark in the set of reference marks and the first boundary of the first etch mask.

When the measured first distance is outside a margin of a first target distance, then the first etch mask can be removed from the top level, the first exposure setting can be changed; a next first etch mask can be formed using the changed first exposure setting, and the measuring step can be repeated. When the measured first distance is inside the margin, then the first etch mask can be used in a first etch-trim process. The first exposure setting can include exposure energy and focus center calibrated to form the first etch-trim mask.

In one example described herein, the set of levels includes W levels L(i) for i going from 1 to W. The first etch-trim process can include iteratively trimming the first etch-trim mask and etching one level using the trimmed first etch-trim mask for a first number N1 of iterations in the first etch-trim cycle to form N1 steps on N1 respective levels L(i) for i going from W−N1 to W−1, wherein the N1 steps are disposed between the first reference mark and the second reference mark. The first etch-trim process can result in transferring the first reference mark from a top level L(W) in the set of levels to a level L(W−N1−1) in the set of levels.

The second etch-trim cycle can comprise forming a second etch-trim mask on the top level, using a second exposure setting, the second etch-trim mask having a second boundary; and measuring a second distance between the second reference mark in the set of reference marks and the second boundary of the second etch-trim mask.

When the measured second distance is outside a margin of a second target distance, then the second etch mask can be removed from the top level, the second exposure setting can be changed; a next second etch mask can be formed using the changed second exposure setting, and the measuring the second distance step can be repeated. When the measured second distance is inside the margin, then the second etch mask can be used in a second etch-trim process. The second exposure setting can include exposure energy and focus center calibrated to form the second etch-trim mask.

The set of levels includes W levels L(i) for i going from 1 to W. The second etch-trim process can include iteratively trimming the second etch-trim mask and etching one level using the trimmed second etch-trim mask for a second number N2 of iterations in the second etch-trim cycle to form N2 steps on N2 respective levels L(i) for i going from W−N2 to W−1, wherein the N2 steps are disposed between the second reference mark and a third reference mark in the set of reference marks. The second etch-trim process can result in transferring the second reference mark from a top level L(W) in the set of levels to a level L(W−N2−1) in the set of levels, and transferring the first reference mark from the level L(W−N1−1) in the set of levels to a level L(W−N1−N2−2) in the set of levels.

The first exposure setting can be different than the second exposure setting, and the first target distance can be different than the second target distance. A first number of steps formed in the first etch-trim cycle can be different than a second number of steps formed in the second etch-trim cycle. The etch-trim process can include more than one etch-trim cycle using more than one etch-trim mask.

A device is described including a set of levels on a substrate, the set of levels including W levels L(i) for i going from 0 to W. The set of levels includes at least a first subset of levels L(i) for i going from 0 to N1, a first reference mark being disposed in a level L(0) in the first subset. A distance between the first reference mark in the level L(0) in the first subset and a first boundary of a level L(1) in the first subset is within a margin of a first target distance.

The set of levels includes a second subset of levels L(i) for i going from N1+1 to N1+1+N2, a second reference mark being disposed in a level L(N1+1) in the second subset. A second distance between the second reference mark in the level L(N1+1) and a second boundary of the level L(N1+2) in the second subset is within a margin of a second target distance.

The second target distance can be different than the first target distance. The first subset of the set of levels has a first number of levels, the second subset of the set of levels has a second number of levels, and the first number of levels can be different than the second number of levels. Each of the levels in the set of levels L(i) for i going from 1 to W can include a layer of conductive material and a layer of insulating material.

Other aspects and advantages of the present technology can be seen on review of the drawings, the detailed description, and the claims which follow.

BRIEF DESCRIPTION OF THE DRAWINGS

FIG. 1 is a simplified cross-sectional view of a semiconductor device structure, showing the result of forming an etch mask on the substrate, where the etch mask has a boundary that can result in a dimension of the etch mask between two opposite boundaries being greater than a specified dimension and beyond manufacturing tolerances (prior art).

FIG. 2 is a simplified cross-sectional view of the structure, showing the result of forming an etch mask on the substrate, where the etch mask has a boundary that can result in a dimension of the etch mask between two opposite boundaries being less than a specified dimension and beyond manufacturing tolerances (prior art).

FIGS. 3-9 illustrate one example of process steps used in forming an aligned mask in accordance with the present technology.

FIGS. 16A-16F illustrate alternative lithographic mask patterns for the reference mark in a reference mark etch mask used in formation of the reference mark pattern.

DETAILED DESCRIPTION

Figure 3:
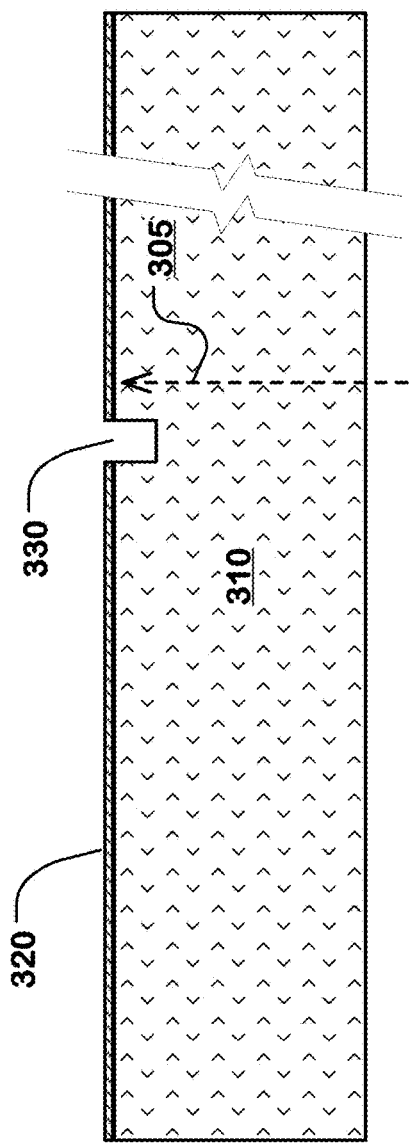

The following description will typically be with reference to specific structural embodiments and methods. It is to be understood that there is no intention to limit the technology to the specifically disclosed embodiments and methods but that the technology may be practiced using other features, elements, methods and embodiments. Preferred embodiments are described to illustrate the present technology, not to limit its scope, which is defined by the claims. Those of ordinary skill in the art will recognize a variety of equivalent variations on the description that follows. Like elements in various embodiments are commonly referred to with like reference numerals.

FIG. 1 is a simplified cross-sectional view of a semiconductor device structure, showing the result of forming an etch mask 141 on the substrate 110, where the etch mask 141 has a boundary 145, and the substrate can have a layer of insulating material 120 on an upper surface.

While the boundary 145 of the etch mask is shown, another boundary at an opposite side of the etch mask 141 is not shown, indicating that the etch mask has a dimension so large that only one of two opposite boundaries of the etch mask can be easily monitored at a time, for example, by using an inline SEM (scanning electronic microscope). In other words, two opposite boundaries of the etch mask cannot be easily monitored simultaneously due to the large dimension of the etch mask. Consequently it is difficult to directly measure a dimension of the etch mask between two opposite boundaries, and to adjust the etch mask accordingly.

In order for the etch mask to be formed with a dimension between two opposite boundaries as specified, two opposite boundaries should be aligned with two ideal locations on the wafer, one at each side of the etch mask. One of the two ideal locations (e.g. 105) is shown at one side of the etch mask, while another of the two ideal locations is not shown at an opposite side of the etch mask. An ideal location may not be a physical feature on the substrate. Rather it may be a location specified nominally in the layout of the device.

In this example, an ideal location 105 is between a boundary 145 of the etch mask 141 and another boundary of the etch mask 141 opposite the boundary 145, so that a distance 115 between the ideal location 105 and the boundary 145 can be too large, so that the position of the mask is out of alignment. In other words, a distance between the boundary 145 and the other boundary of the etch mask 141 opposite the boundary 145 may be too large.

FIG. 2 is a simplified cross-sectional view of a semiconductor device structure, showing the result of forming an etch mask 142 on the substrate 110, where the etch mask 142 has a boundary 146. In this example, the boundary 146 is between another boundary of the etch mask 142 opposite the boundary 146 and an ideal location 105, so that a distance 116 between the ideal location 105 and the boundary 146 can be too large in an opposite direction. In other words, a distance between the boundary 146 and the other boundary of the etch mask 142 opposite the boundary 146 may be too small.

FIGS. 3-9 illustrate one example of process steps used in forming an aligned mask.

FIG. 3 is a simplified cross-sectional view of a portion of an IC device structure, showing the result of etching a reference mark 330 on a substrate 310 to demarcate a boundary of an etch region. An ideal location for a boundary of an etch region is shown as a dotted line 305. The reference mark can be etched with a dry or wet etch, using a reference mark etch mask. The reference mark etch mask can be merged with other processes to save the process steps and costs.

The substrate in this example can include a layer of insulating material 320 on an upper surface of the substrate. The reference mark 330 can penetrate through the layer of insulating material 320 and into underlying materials in the substrate 310. In one embodiment, subsequent to a process step to etch a reference mark, a next process step can be to perform deep N-well implantation (not shown). The layer of insulating material 320 can prevent tunneling effect at the next process step. A reference mark can have for example, a depth of about 140 nm and a width of about 150 nm, and the layer of insulating material can have a thickness of about 20 nm.

Figure 4:
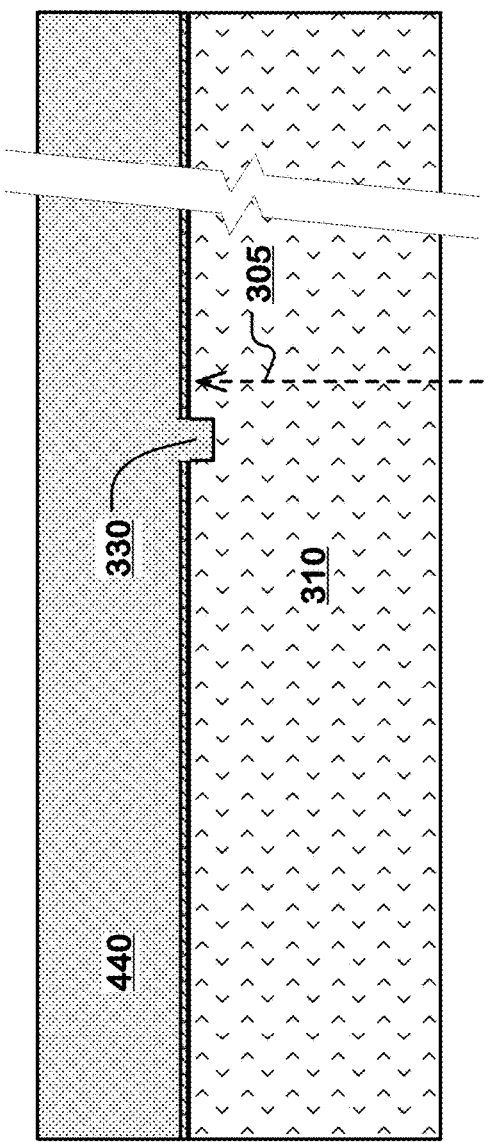

FIG. 4 is a simplified cross-sectional view of the structure, showing the result of forming a layer of mask material 440 on the substrate, including covering the reference mask 330. The mask material can be photoresist material or different types of mask material.

Figure 5:
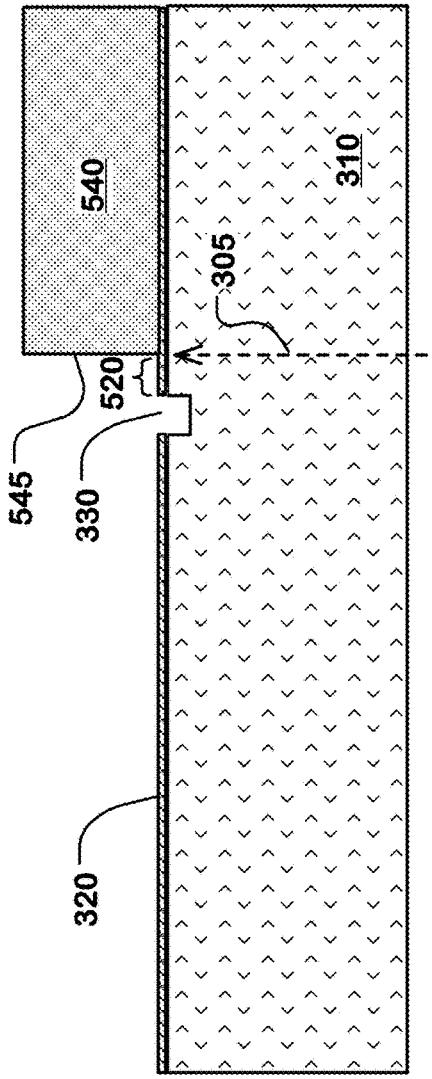

FIG. 5 is a simplified cross-sectional view of the structure, showing the result of forming a first etch mask 540 on the substrate, using an exposure setting on the mask material 440. The first etch mask 540 has a boundary 545. An exposure setting can include exposure energy and focus center calibrated to form the etch mask, and is further described in connection to FIGS. 11-13 and 14A/B/C. The reference mark 330 is disposed parallel to the boundary 545 of the first etch mask 540. Lithography equipment used in semiconductor manufacturing such as ASML scanners, Canon scanners and Nikon scanners can use parameters such as exposure energy and focus center in a lithography and etch process.

While the boundary 545 of the first etch mask is shown, another boundary at an opposite side of the first etch mask 540 is not shown, indicating that the first etch mask has a dimension so large that only one of two opposite boundaries of the first etch mask can be easily monitored at a time, for example, by using an inline metrology tool, such as an inline SEM (scanning electronic microscope).

A distance 520 between the reference mark 330 and the boundary 545 of the first etch mask 540 can be measured, for example, using an inline SEM. The reference mark has a first side proximal to the boundary and a second side distal to the boundary. In one embodiment, the distance is measured between the boundary and the first side of the reference mark proximal to the boundary as appears in an aerial view SEM image, which can show the position of the boundary for example at a level at which the bottom of the first etch mask is disposed. When the measured distance 520 is outside a margin of a target distance, such as plus or minus 5 to 10% of the target distance, then the first etch mask 540 can be removed from the substrate 310, the exposure setting can be changed, a next etch mask can be formed using the changed exposure setting, and the measuring step can be repeated.

A target distance with a margin is specified between the reference mark and a boundary of an etch region. In one embodiment, the target distance with a margin is specified between a boundary of the first etch mask and the first side of the reference mark proximal to the boundary at a level at which the bottom of the first etch mask is disposed. The measurement can be made between other features of the reference mark and the boundary as suits a particular measurement tool or technique. In one embodiment, a target distance can be between about 500 nm (nanometer) and 800 nm, and a margin can be +/−50 nm. When the measured distance is inside the margin, indicating the boundary 545 of the first etch mask 540 is aligned with the ideal location 305, then the first etch mask 540 can be used in an etch process.

Figure 6:
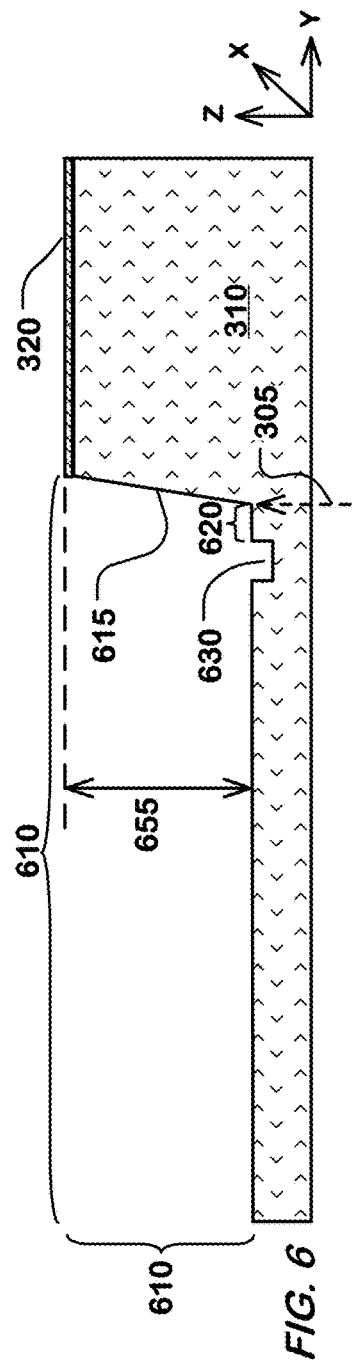

FIG. 6 is a simplified cross-sectional view of the structure in the Z-Y plane, showing the result of using the first etch mask 540 in an etch process, when the measured distance is inside the margin. The etch process can include etching a recess 610 in the substrate 310 using the first etch mask 540, with a dry or wet etch. A depth 655 of the recess 610 can be about 1950 nm, for example. A dimension between two opposite boundaries of the recess can be between 500 µm (micrometer) and 10,000 µm, for example, in cases in which a large memory array is implemented in the recess. The etch process can result in transferring the reference mark 330 to a bottom of the recess. A distance 620 between a transferred reference mark 630 and a side 615 of the recess 610 can be slightly different than the measured distance 520 which is inside the margin of a target distance, due to a slope of the side 615 of the recess 610, the measurement technique, or other factors.

Figure 7:
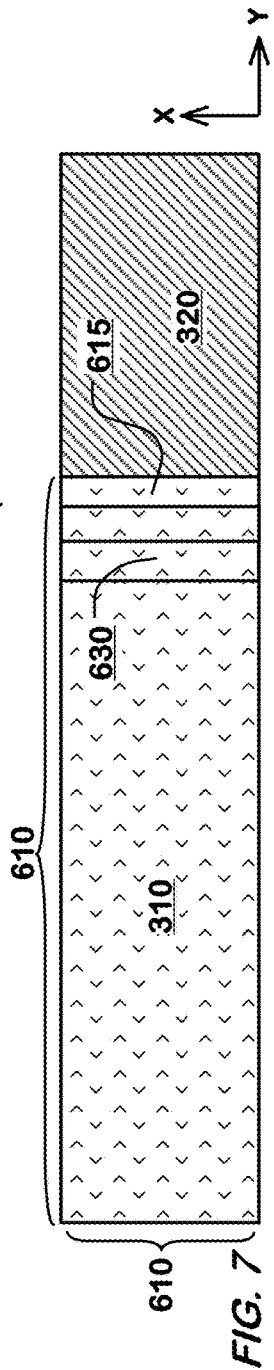

FIG. 7 is a simplified top view of the structure, showing the reference mark 630 disposed parallel to the side 615 of the recess 610, in the X-direction orthogonal to the Z-Y plane.

FIG. 8 is a simplified cross-sectional view of the structure, showing the result of forming a stack of active layers (e.g. 8.1-8.8) separated by insulating material (e.g. 810) over the recess 610, including over the transferred reference mark 630 at the bottom of the recess 610.

FIG. 9 is a simplified cross-sectional view of the structure, showing the result of etching the stack of active layers in the recess to form an isolation region 910 between an upper surface of the substrate and the bottom of the recess that separates an array region 920 disposed in the recess from the transferred reference mark 630. The array region can include the stack of active layers for forming a memory array in the recess. In one embodiment as shown in the example of FIG. 9, a residual of materials in the stack between the isolation region 910 and a periphery region 930 can cover the transferred reference mark at the bottom of the recess. In an alternative embodiment, the transferred reference mark can be disposed at the bottom of the recess in the isolation region 910, not covered by the residual, as described in connection to FIG. 16F.

Figure 10:
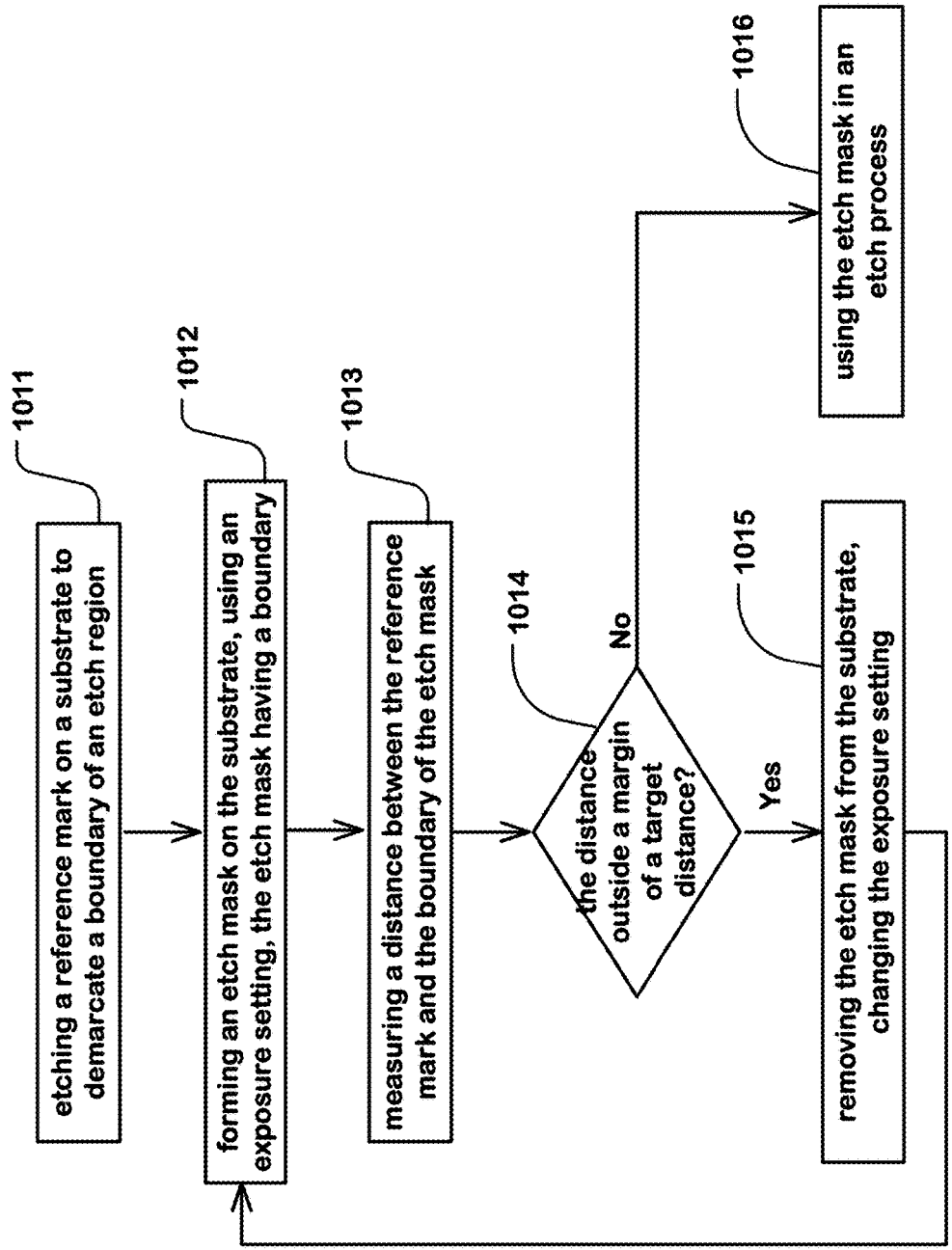
FIG. 10 illustrates a simplified flowchart of process steps used in forming an aligned mask.

FIG. 10 illustrates a simplified flowchart of process steps used in forming an aligned mask. At Step 1011, a reference mark is etched on a substrate to demarcate a boundary of an etch region, as described in connection to FIG. 3. At Step 1012, an etch mask is formed on the substrate, using an exposure setting, where the etch mask has a boundary, as described in connection to FIGS. 4-5.

At Step 1013, a distance is measured between the reference mark and the boundary of the etch mask, for example, using an inline SEM. At Step 1014, it is determined whether the measured distance is outside or inside a margin of a target distance. At Step 1015, when the measured distance is outside a margin of a target distance, then the etch mask can be removed from the substrate, the exposure setting can be changed, a next etch mask can be formed using the changed exposure setting (Step 1012), and the measuring step 1013 can be repeated.

At Step 1016, when the measured distance is inside the margin, then the etch mask can be used in an etch process. An etch process can include etching a recess in the substrate using the etch mask, resulting in transferring the reference mark to a bottom of the recess, as described in connection to FIG. 6.

Figure 11:
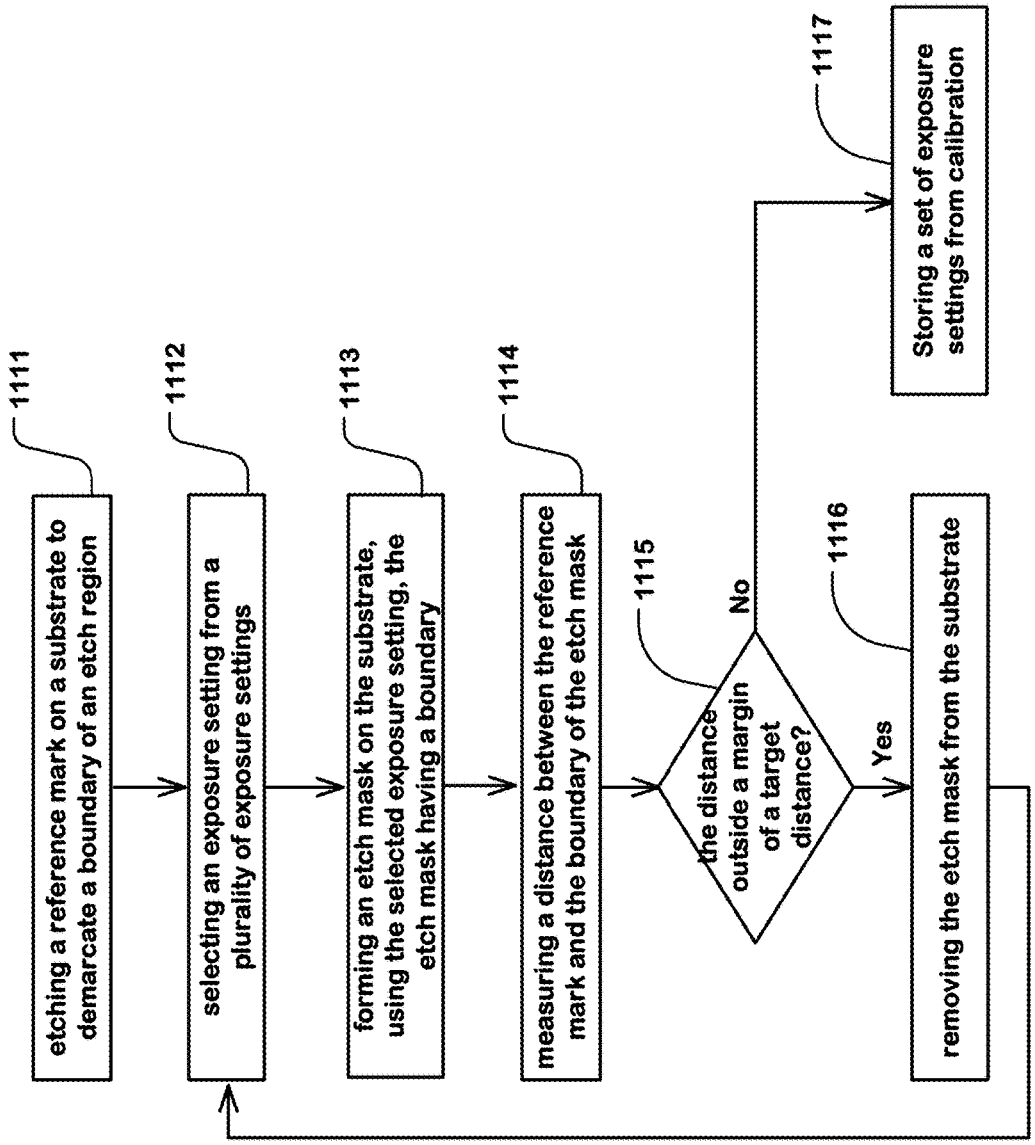
FIG. 11 illustrates a simplified flowchart of process steps used in calibrating the exposure setting for use with forming an aligned mask.

FIG. 11 illustrates a simplified flowchart of process steps used in calibrating the exposure setting for use with forming an aligned mask as described in connection to FIGS. 3-7 and 10. At Step 1111, a reference mark is etched on a substrate to demarcate a boundary of an etch region, as described in connection to FIG. 3.

At Step 1112, an exposure setting is selected from a plurality of exposure settings, which is described in connection to FIG. 12. At Step 1113, an etch mask is formed on the substrate, using the selected exposure setting, where the etch mask has a boundary. Forming an etch mask on the substrate is described in connection to FIGS. 4-5.

At Step 1114, a distance is measured between the reference mark and the boundary of the etch mask, for example, using an inline SEM. At Step 1115, it is determined whether the measured distance is outside or inside a margin of a target distance. At Step 1116, when the measured distance is outside a margin of a target distance, then the etch mask can be removed from the substrate. A different exposure setting can be selected (Step 1112), a next etch mask can be formed using the different exposure setting (Step 1113), and the measuring step can be repeated (Step 114).

At Step 1117, when the measured distance is inside the margin of the target distance, then a set of exposure settings from the calibration can be stored, so exposure settings from the calibration set can be selected for use with process steps in forming an aligned mask in production of multiple chips on one or more wafers. For instance, one exposure setting from the calibration set may result in moving the boundary of an etch mask in a direction to increase a distance between the reference mark and the boundary, while another exposure setting from the calibration set may result in moving the boundary of an etch mask in another direction to decrease a distance between the reference mark and the boundary.

The calibration set can include a particular exposure setting that results in the measured distance being inside the margin. This particular exposure setting can be stored as an optimal exposure setting, and used as a first selection with process steps in forming an aligned mask in production of multiple chips on one or more wafers. For each exposure setting in the calibration set, the parameters stored can include exposure energy, focus center, and a corresponding distance between a reference mark and a boundary of an etch mask.

Figure 12:
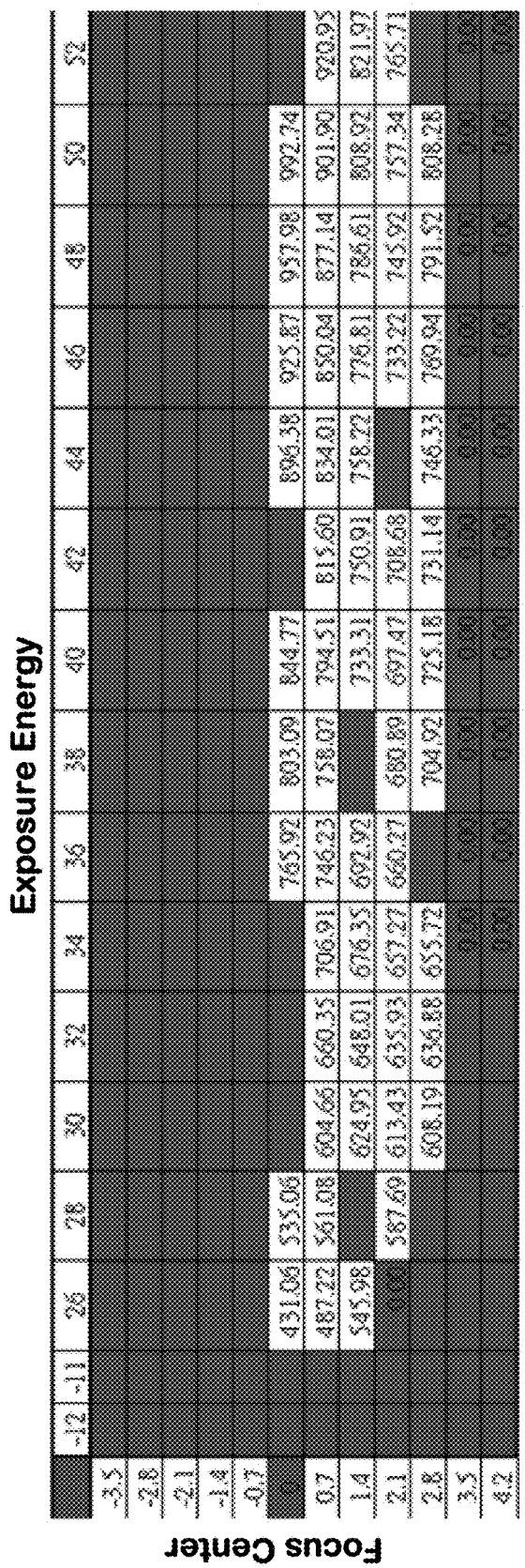
FIG. 12 illustrates one example of a matrix of exposure energy and focus center, representing a plurality of exposure settings.

FIG. 12 illustrates one example of a matrix of exposure energy and focus center, representing a plurality of exposure settings. The matrix shows measured distances in nm (nanometer) between the reference mark and the boundary of the etch mask, as a function of exposure energy in milli-Joule per $cm^2$ and focus center in µm (micrometer). For example, for a target distance of 700 nm with a margin of +/−50 nm, a measured distance corresponding to exposure energy of 40.26 milli-Joule per $cm^2$ and focus center of 1.61 µm is closer to the margin of the target distance than other measured distances in the matrix. In this example, the optimal exposure setting includes exposure energy of 40.26 milli-Joule per $cm^2$ and focus center of 1.61 µm. Stored exposure settings can include a nominally optimal exposure setting derived during calibration as the starting point, exposure settings that result in distances within the margin of the target distance, or all exposure settings with measured distances. In addition, indicators of performance can be stored along with the stored exposure settings to indicate, when forming an aligned mask using the stored exposure settings, how to select a next exposure setting to move the boundary of an etch mask in a direction to increase or decrease a distance between the reference mark and the boundary of the etch mask.

Figure 13:
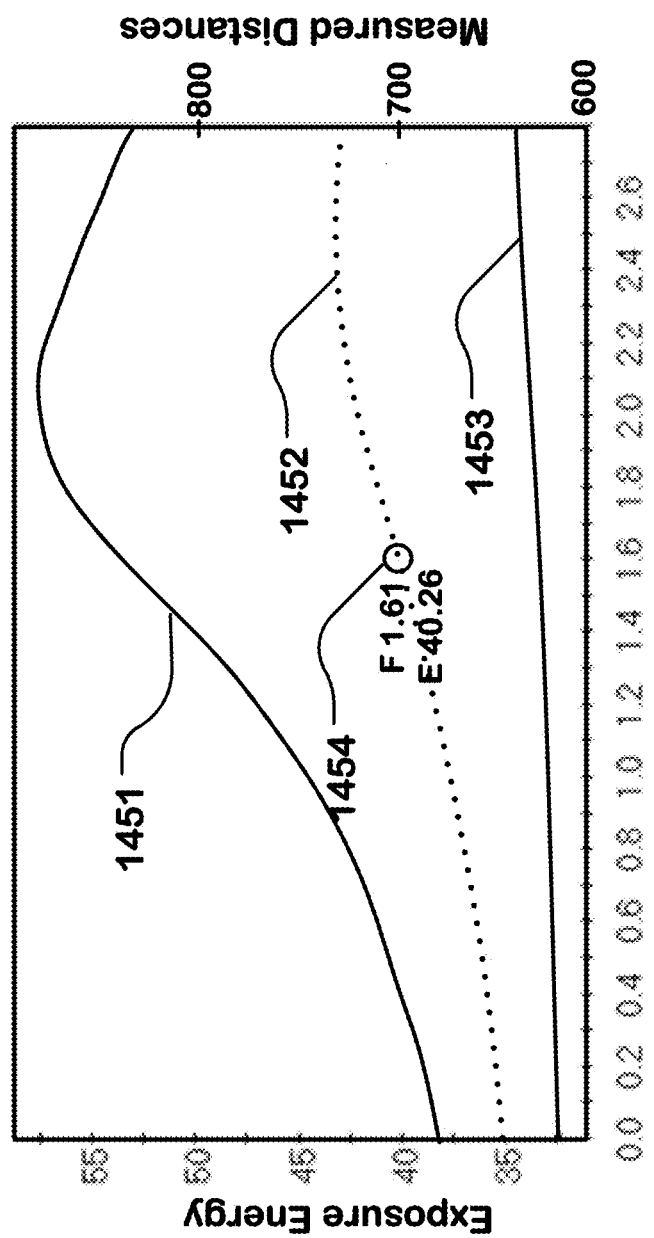
FIG. 13 is a graph showing curves for measured distances between the reference mark and the boundary of the etch mask, as a function of exposure energy and focus center.

FIG. 13 is a graph showing curves for measured distances between the reference mark and the boundary of the etch mask, as a function of exposure energy and focus center. An area between the upper curve 1451 and the lower curve 1453 include measured distances inside a margin of a target distance. In this example, the dotted curve 1452 corresponds to distances that can meet or be very close to the target distance of 700 nm, as predicted using experimental data as illustrated in FIG. 12. The dotted curve can include a nominally optimal exposure setting having exposure energy of 40.26 milli-Joule per $cm^2$ and focus center of 1.61 µm.

Figure 14C:
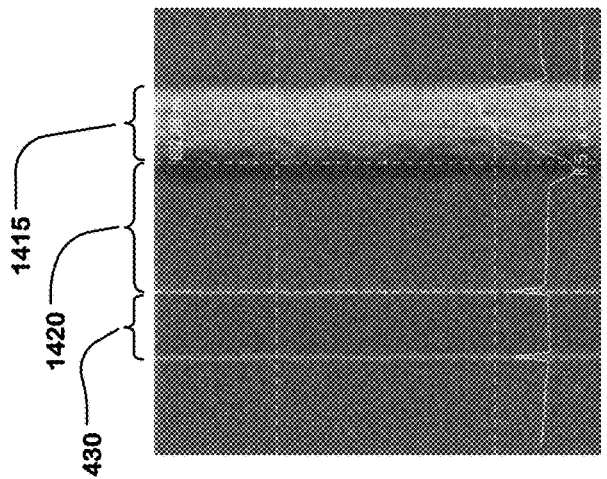
FIG. 14C is an image illustrating a reference mark, a boundary of the etch mask, and a distance between the reference mark and the boundary of the etch mask.
Figure 14A:
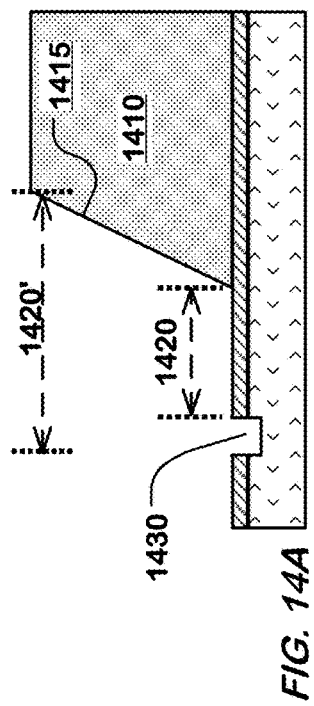
FIG. 14A illustrates a distance between a reference mark and a boundary of an etch mask.

FIG. 14A illustrates a distance 1420 between a reference mark 1430 and a boundary 1415 of an etch mask 1410 in a cross sectional view of the structure. In one embodiment, the measurement could be made from the proximal side of the reference mark to a feature at the bottom edge of the etch mask as shown at 1420. In an alternative, the measurement could be made from the distal side of the reference mark to a feature at the top edge of the etch mask as shown at 1420'. The distance can be measured by using an inline metrology tool, such as an inline SEM (scanning electronic microscope) which produces an aerial image on which the measurement can be directly made. Measurements can be compared against a margin of a target distance, for determining exposure settings that are inside the margin and an optimal exposure setting that can result in a distance closer to the target distance than other exposure settings. A set of exposure settings from the calibration can be stored, including the optimal exposure setting and some of other exposure settings, so exposure settings from the calibration set can be selected for use with process steps in forming an aligned mask in production of multiple chips on one or more wafers.

Figure 14B:
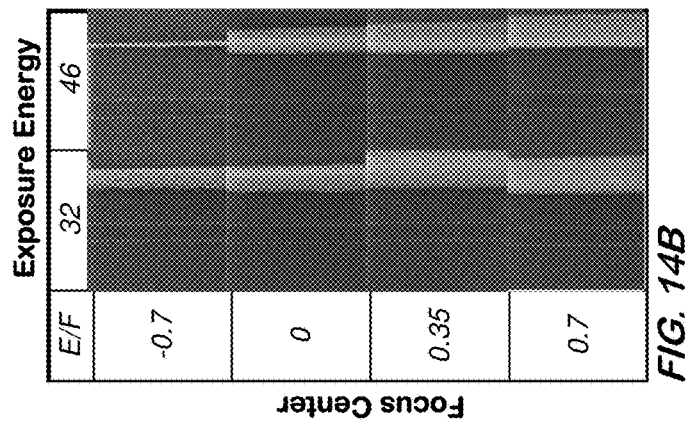
FIG. 14B illustrates images in top view of the structure shown in FIG. 14A.

FIG. 14B illustrates that selecting an exposure setting from a plurality of exposure settings in a calibration process can result in different distances between the reference mark and the boundary of the etch mask. For example, FIG. 14B illustrates 8 images in 4 rows and 2 columns, in top view of the structure shown in FIG. 14A. Each of the 8 images illustrates a reference mark, a boundary of an etch mask, and a distance between the reference mark and the boundary of the etch mask. Each of the 8 images corresponds to a respective exposure setting and a distance resultant from the exposure setting. For example the image at the upper-left corner corresponds to an exposure setting including exposure energy of 32 milli-Joule per cm$^2$ and focus center of −0.7 μm and a first distance. The image at the lower-right corner corresponds to an exposure setting including exposure energy of 46 milli-Joule per cm$^2$ and focus center of 0.7 μm and a second distance different than the first distance. The boundary widths are different in the images in FIG. 14B, due to variations in exposure energy and focus center.

FIG. 14C is an image like the images in FIG. 14B, illustrating a reference mark 1430, a boundary 1415 of the etch mask 1410, and a distance 1420 between the reference mark and the boundary of the etch mask. The reference mark is disposed parallel to the boundary of the etch mask. The width of a reference mark can be about 150 nm to 1,000 nm, as constrained by factors such as inline SEM measurement magnification, inline SEM measurement fail ratio, and a process design for etching a circuit feature, such as a recess or a staircase, including the reference mark. For instance, for a process to form a staircase using a reference mark, the width of the reference mark (e.g. 150 nm) must be less than the width of a stairstep (e.g. 500 nm) in a staircase.

Figure 15A:
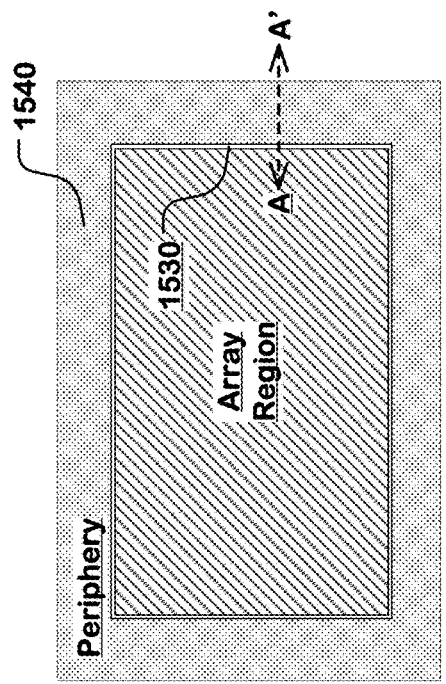
FIG. 15A illustrates a lithographic mask pattern for a mask used to make a reference mark on a substrate.

FIG. 15A illustrates a lithographic mask pattern 1510 for a mask used to make a reference mark on a substrate. The mask pattern 1510 includes a reference mark pattern 1515 for a reference mark in the shape of a line around the perimeter of a rectangle, between an array region for forming a memory array and a periphery region for forming periphery circuitry.

Figure 15C:
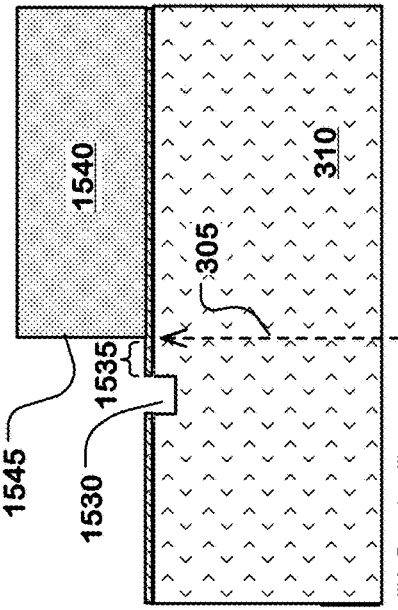
FIG. 15C is a simplified top view of the structure, showing the result of etching a reference mark on a substrate using the mask pattern shown in FIG. 15A, and then forming an etch mask on the substrate using the mask pattern shown in FIG. 15B.
Figure 15B:
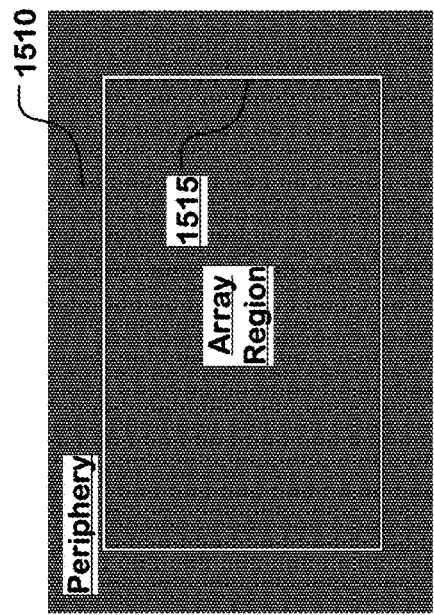
FIG. 15B illustrates a lithographic mask pattern 1520 for a mask used to make a recess in a substrate.

FIG. 15B illustrates a lithographic mask pattern 1520 for a mask used to make a recess in a substrate. The mask pattern 1520 includes a rectangle (e.g. 1525) for the recess where an array region can be disposed.

FIG. 15C is a simplified top view of the structure, showing the result of etching a reference mark 1530 on a substrate using the mask pattern 1510, and then forming an etch mask 1540 on the substrate using the mask pattern 1520 and using the exposure setting as described herein. For clarity, a distance between the reference mark 1530 and a boundary of the etch mask 1540 is shown in FIG. 15D.

Figure 15D:
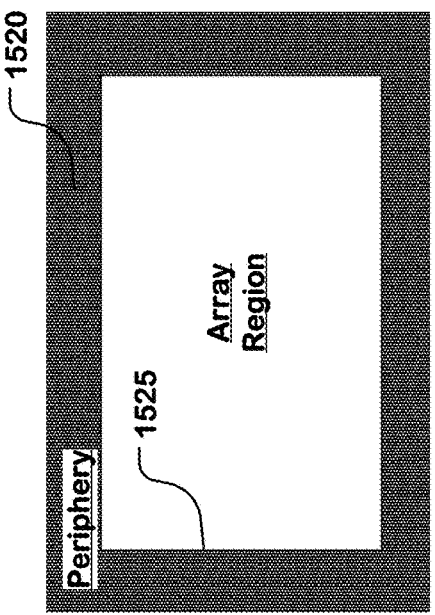
FIG. 15D illustrates a cross-section of the structure shown in FIG. 15C.

FIG. 15D illustrates a cross-section of the structure taken along the line A-A' in FIG. 15C. FIG. 15D shows a distance 1535 between the reference mark 1530 and a boundary 1545 of the etch mask 1540 on a substrate 310.

FIGS. 16A-16F illustrate alternative lithographic mask patterns for the reference mark in a reference mark etch mask used for exposure of photoresist in formation of the reference mark pattern. FIG. 16A illustrates a mask pattern in the shape of four "L" shaped lines (e.g. 1601a, 1601b, 1601c, 1601d) at respective corners of the perimeter of a rectangle, between an array region for forming a memory array and a periphery region for forming periphery circuitry, where each of the "L" shaped lines includes two segments oriented transversely to one another.

FIG. 16B illustrates a mask pattern in the shape of two lines (e.g. 1602a, 1602b) around the perimeter of a rectangle, between an array region for forming a memory array and a periphery region for forming periphery circuitry, the two lines being disposed parallel to and opposite each other.

FIG. 16C illustrates a mask pattern in the shape of four lines around the perimeter of a rectangle, between an array region for forming a memory array and a periphery region for forming periphery circuitry, where the four lines are not connected to each other, and include first two parallel lines (e.g. 1603a, 1603b) and second two parallel lines (e.g. 1603c, 1603d) orthogonal to the first two parallel lines.

FIG. 16D illustrates a mask pattern in the shape of a first pair of lines opposite each other across the array region in a first direction (e.g. 1604a, 1604b) and a second pair of lines opposite each other across the array region in a second direction orthogonal to the first direction (e.g. 1604c, 1604d), where the lines in the second pair include fragmented segments.

FIG. 16E illustrates a mask pattern in the shape of concentric rectangle perimeters (e.g. 1605a, 1605b, 1605c). FIG. 16F illustrates a cross-sectional view of the structure, taken along a line B-B' in FIG. 16E. FIG. 16F illustrates a first rectangle in the concentric rectangle perimeters (e.g. 1605a) disposed at the bottom of the recess 610 in the isolation region 910, a second rectangle in the concentric rectangles (e.g. 1605b) disposed at the bottom of the recess 610 between the isolation region 910 and the periphery region 930, and a third rectangle in the concentric rectangles (e.g. 1605c) disposed in the periphery region 930.

Figure 17:
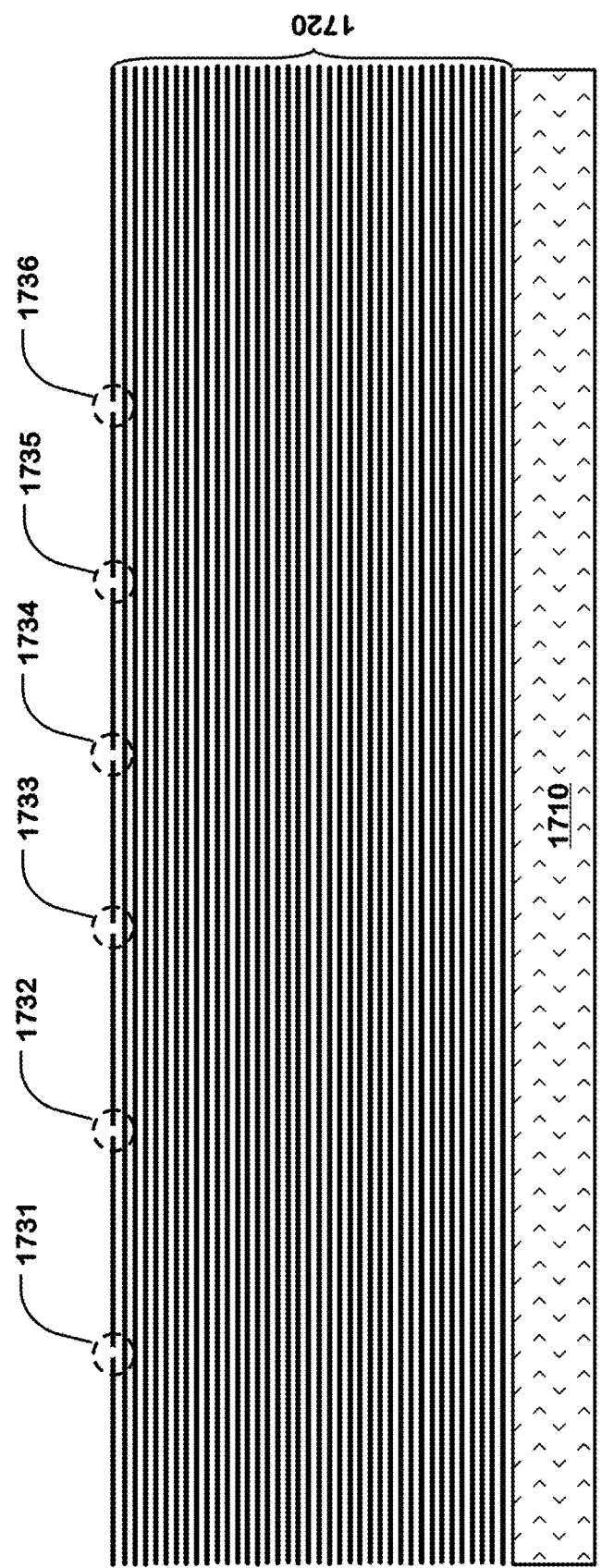
FIGS. 17-23 illustrate one example of process steps used in forming a set of aligned masks on a set of level on a substrate.

FIGS. 17-23 illustrate one example of process steps used in forming a set of aligned masks on a set of level on a substrate. FIG. 17 is a simplified cross-sectional view of a portion of an IC device structure, showing the result of etching a set of reference marks (e.g. 1731-1736) on a top level in a set of levels (e.g. 1720) on a substrate 1710 to demarcate boundaries of etch regions. In one embodiment, the set of levels can include 39 levels, and each level in the set of levels can include a layer of sacrificial material (e.g. SiN) and a layer of insulating material. The set of reference marks can be formed using a reference mark etch mask on the set of levels before any other etch mask is formed on the set of levels. The reference mark etch mask is removed after the reference marks in the set of reference marks are etched.

After the etch-trim process as described herein has been performed to form steps at the levels in the set of levels, further process steps can be taken to replace the sacrificial material in the set of levels with a conductive material, so that each level in the set of levels includes a layer of conductive material and a layer of insulating material. The replacement of the sacrificial material with the conductive material can result in a set of levels where each level in the set of levels can include a layer of conductive material and a layer of insulating material.

The conductive material in the set of levels can be electrically conductive semiconductors including heavily doped polysilicon (using dopants such as As, P, B), silicides including TiSi, CoSi, oxide semiconductors, including InZnO, InGaZnO, and combinations of semiconductors and silicides. The conductive material can also be a metal, a conductive compound, or combinations of materials including Al, Cu, W, Ti, Co, Ni, TiN, TaN, TaAlN, and others. The insulating material in the set of levels can include an oxide, nitride, oxynitride, silicate, or others as appropriate for the manufacturing techniques applied. Low dielectric constant materials having a dielectric constant smaller than that of silicon dioxide, such as $SiCHO_x$, may be preferred. High dielectric constant (high-k) materials having a dielectric constant greater than that of silicon dioxide, such as $HfO_x$, $HfON$, $AlO_x$, $RuO_x$, $TiO_x$, may be included also.

FIGS. 18-23 illustrate FIGS. 17-23 illustrate performing an etch-trim process to form steps at the levels in the set of levels, where the etch-trim process includes at least a first etch-trim cycle using a first reference mark (e.g. 1731) in the set of reference marks and a second etch-trim cycle using a second reference mark (e.g. 1732) in the set of reference marks.

Figure 18:
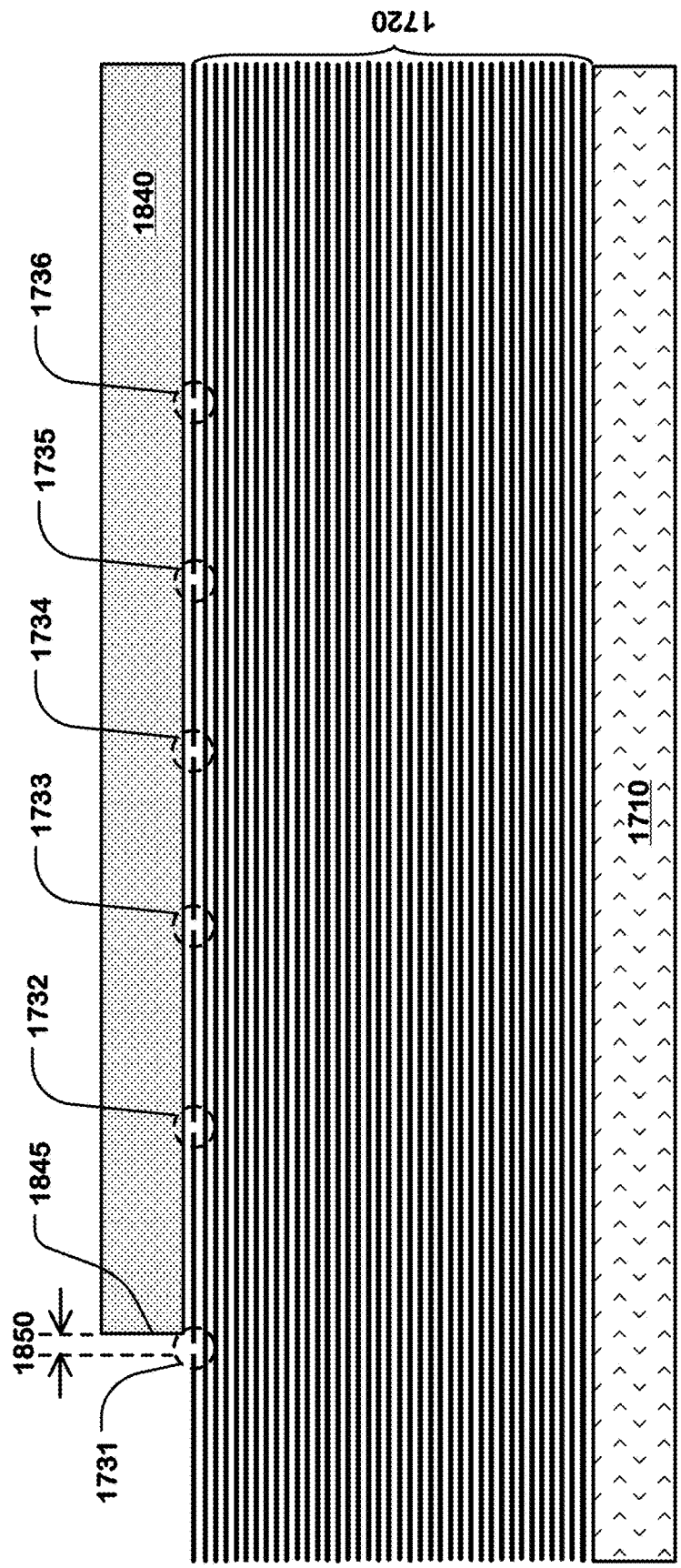

FIG. 18 illustrates the result of forming a first etch-trim mask (e.g. 1840) on the top level of the set of levels 1720, using a first exposure setting in the first etch-trim cycle. The first exposure setting can include exposure energy and focus center calibrated to form the first etch-trim mask. The first etch-trim mask has a first boundary 1845. A first distance 1850 between the first reference mark 1731 in the set of reference marks and the first boundary 1845 of the first etch-trim mask 1840 can be measured, for example, using an inline SEM (scanning electronic microscope).

When the measured first distance is outside a margin of a first target distance, then the first etch-trim mask 1840 can be removed from the top level, the first exposure setting can be changed; a next first etch mask can be formed on the top level of the set of levels 1720 using the changed first exposure setting, and the measuring step of the first distance can be repeated. A first target distance with a margin is specified between the first reference mark and the first boundary of the first etch-trim mask 1840. In one embodiment, a first target distance can be about 100-1,000 nm (nanometer), and a margin of the first target distance can be +/−30 nm.

When the measured first distance 1850 is inside the margin of the first target distance, then the first etch-trim mask 1840 can be used in a first etch-trim process.

The set of levels includes W levels L(i) for i going from 1 to W.

Figure 19:
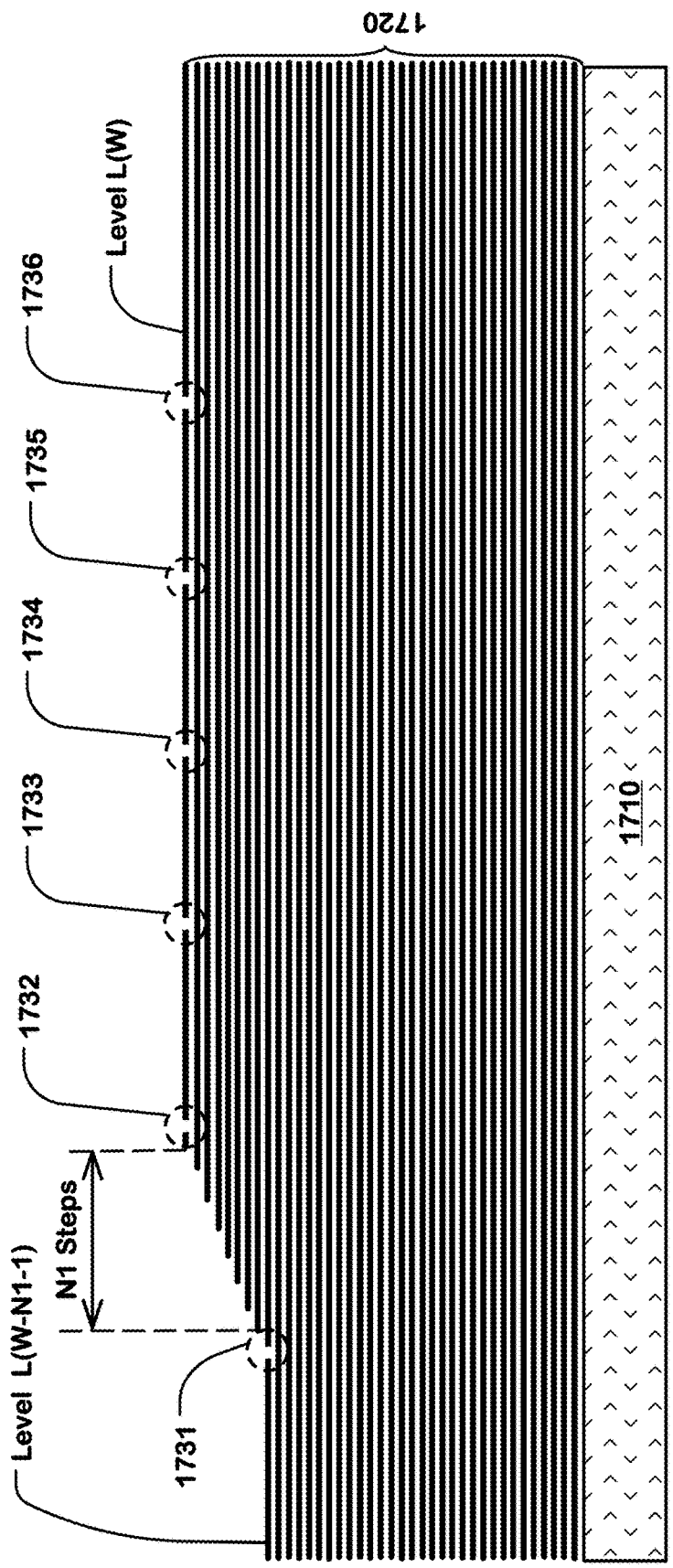

FIG. 19 illustrates the result of iteratively trimming the first etch-trim mask 1840 and etching one level using the trimmed first etch-trim mask for a first number N1 of iterations in the first etch-trim cycle to form N1 steps on N1 respective levels L(i) for i going from W−N1 to W−1, wherein the N1 steps are disposed between the first reference mark 1731 and the second reference mark 1732. The first etch-trim process can result in transferring the first reference mark 1731 from a top level L(W) in the set of levels to a level L(W−N1−1) in the set of levels. Basic steps in an etch-trim cycle are described in connection to FIGS. 24A, 24B, 24C and 24D.

Figure 20:
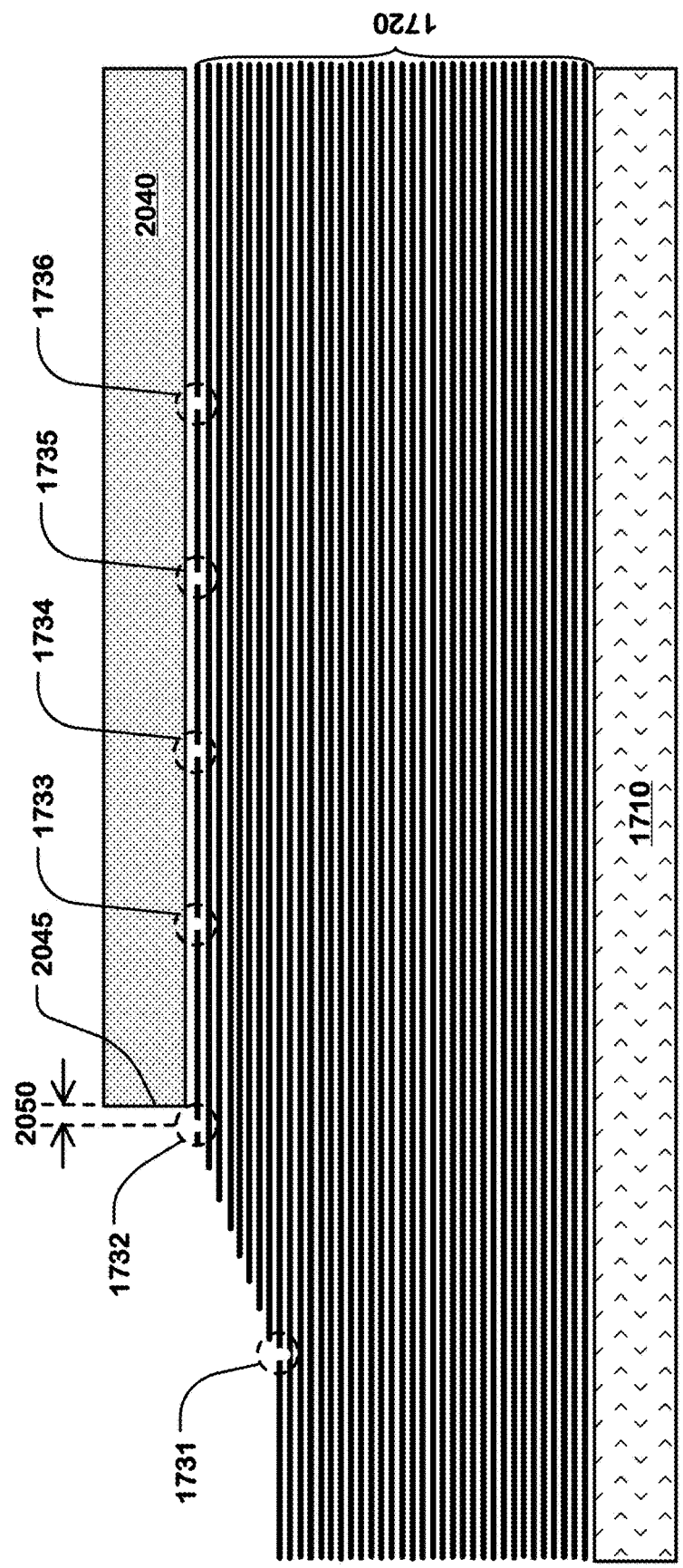

FIG. 20 illustrates the result of forming a second etch-trim mask (e.g. 2040) on the top level of the set of levels 1720, using a second exposure setting in the second etch-trim cycle. The second exposure setting can include exposure energy and focus center calibrated to form the second etch-trim mask. The second etch-trim mask has a second boundary 2045. A second distance 2050 between the second reference mark 1732 in the set of reference marks and the second boundary 2045 of the second etch-trim mask 2040 can be measured, for example, using an inline SEM.

When the measured second distance 2050 is outside a margin of a second target distance, then the second etch-trim mask 2040 can be removed from the top level, the second exposure setting can be changed; a next second etch mask can be formed on the top level of the set of levels 1720 using the changed second exposure setting, and the measuring step of the second distance can be repeated. A second target distance with a margin is specified between the second reference mark and the second boundary of the second etch-trim mask 2040. A second target distance and a margin of the second target distance can be different than a first target distance and a margin of the first target distance described in connection to FIG. 18.

When the measured second distance 2050 is inside the margin of the second target distance, then the second etch-trim mask 2040 can be used in a second etch-trim process.

Figure 21:
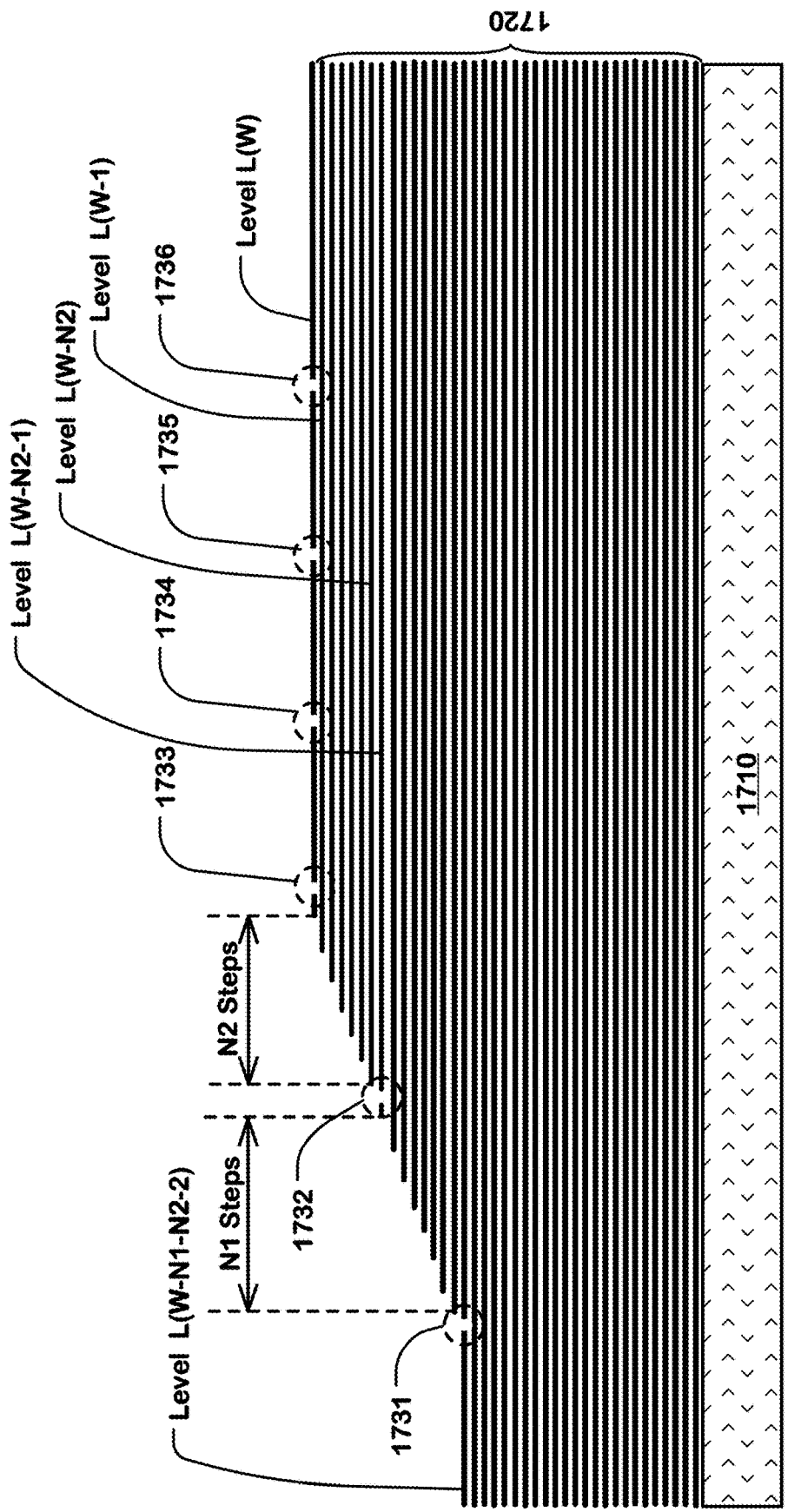

FIG. 21 illustrates the result of iteratively trimming the second etch-trim mask 2040 and etching one level using the trimmed second etch-trim mask for a second number N2 of iterations in the second etch-trim cycle to form N2 steps on N2 respective levels L(i) for i going from W−N2 to W−1, wherein the N2 steps are disposed between the second reference mark 1732 and a third reference mark 1733 in the set of reference marks. The second etch-trim process can result in transferring the second reference mark 1732 from a top level L(W) in the set of levels to a level L(W−N2−1) in the set of levels, and transferring the first reference mark from the level L(W−N1−1) in the set of levels to a level L(W−N1−N2−2) in the set of levels. Basic steps in an etch-trim cycle are described in connection to FIGS. 24A, 24B, 24C and 24D.

The first exposure setting can be different than the second exposure setting, and the first target distance can be different than the second target distance. A first number of steps formed in the first etch-trim cycle can be different than a second number of steps formed in the second etch-trim cycle. The etch-trim process includes more than one etch-trim cycle using more than one etch-trim mask, such as the first etch-trim cycle using the first etch-trim mask and the second etch-trim cycle using the second etch-trim mask.

In one embodiment, a number W of levels in the set of levels can be 39, a first number N1 of iterations in the first etch-trim cycle can be 7, a second number N2 of iterations in the second etch-trim cycle can be 6, and a number of iterations in the third through sixth etch-trim cycles can be 5. Those of ordinary skill in the art can determine the numbers of iterations in all etch-trim cycles in the etch-trim process including N1 and N2, based on parameters such as a number of levels in a set of levels, a thickness of a level in the set of levels including a layer of sacrificial material and a layer of insulating material, a thickness of the etch-trim mask, a width of a staircase, and the etch recipe.

Figure 22:
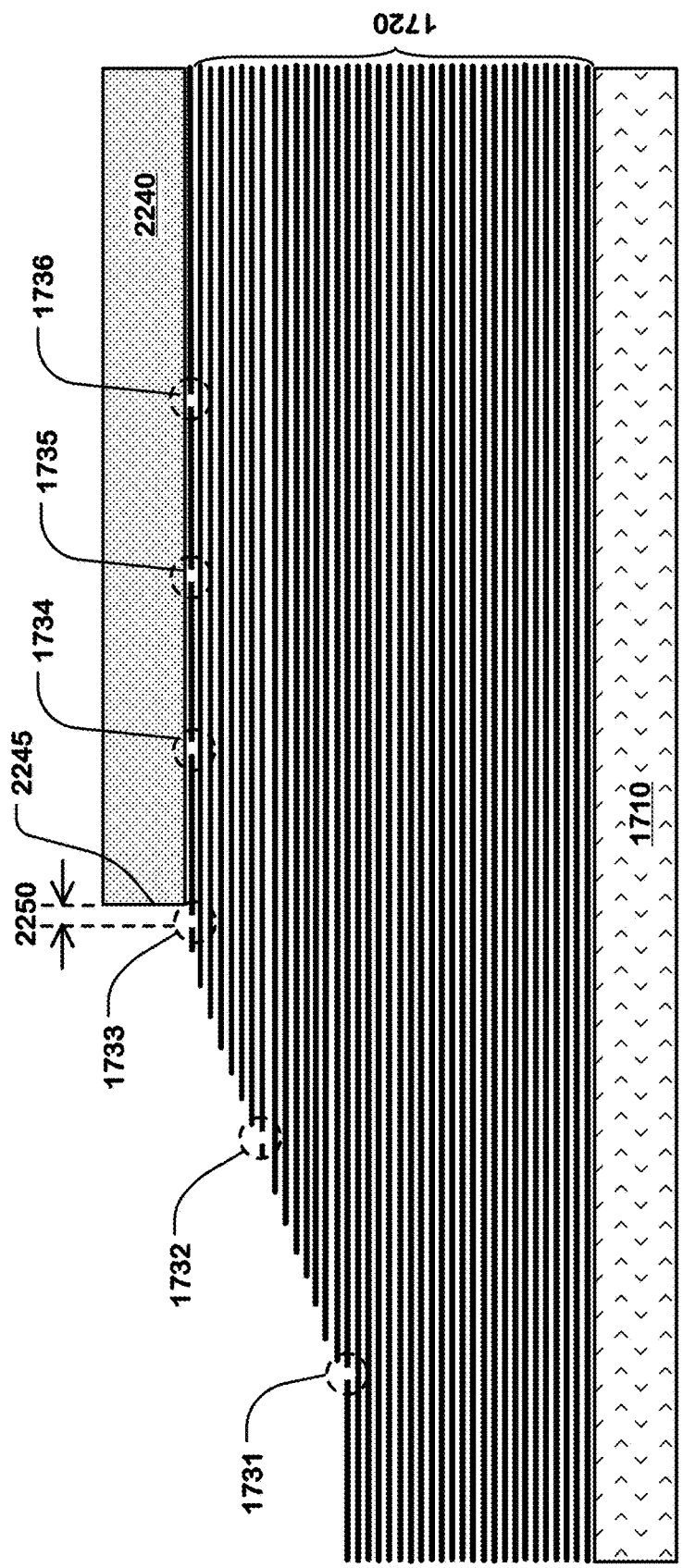

FIG. 22 illustrates the result of forming a third etch-trim mask (e.g. 2240) on the top level of the set of levels 1720, using a third exposure setting in the third etch-trim cycle. The third exposure setting can include exposure energy and focus center calibrated to form the third etch-trim mask. The third etch-trim mask has a third boundary 2245. A third distance 2250 between the third reference mark 1733 in the set of reference marks and the third boundary 2245 of the third etch-trim mask 2240 can be measured, for example, using an inline SEM.

When the measured third distance 2250 is outside a margin of a third target distance, then the third etch-trim mask 2240 can be removed from the top level, the third exposure setting can be changed; a next third etch mask can be formed on the top level of the set of levels 1720 using the changed third exposure setting, and the measuring step of the third distance can be repeated. A third target distance with a margin is specified between the third reference mark and the third boundary of the third etch-trim mask 2240. A third target distance and a margin of the third target distance can be different than a second target distance and a margin of the second target distance described in connection to FIG. 20.

When the measured third distance 2250 is inside the margin of the third target distance, then the third etch-trim mask 2240 can be used in a third etch-trim process.

Figure 23:
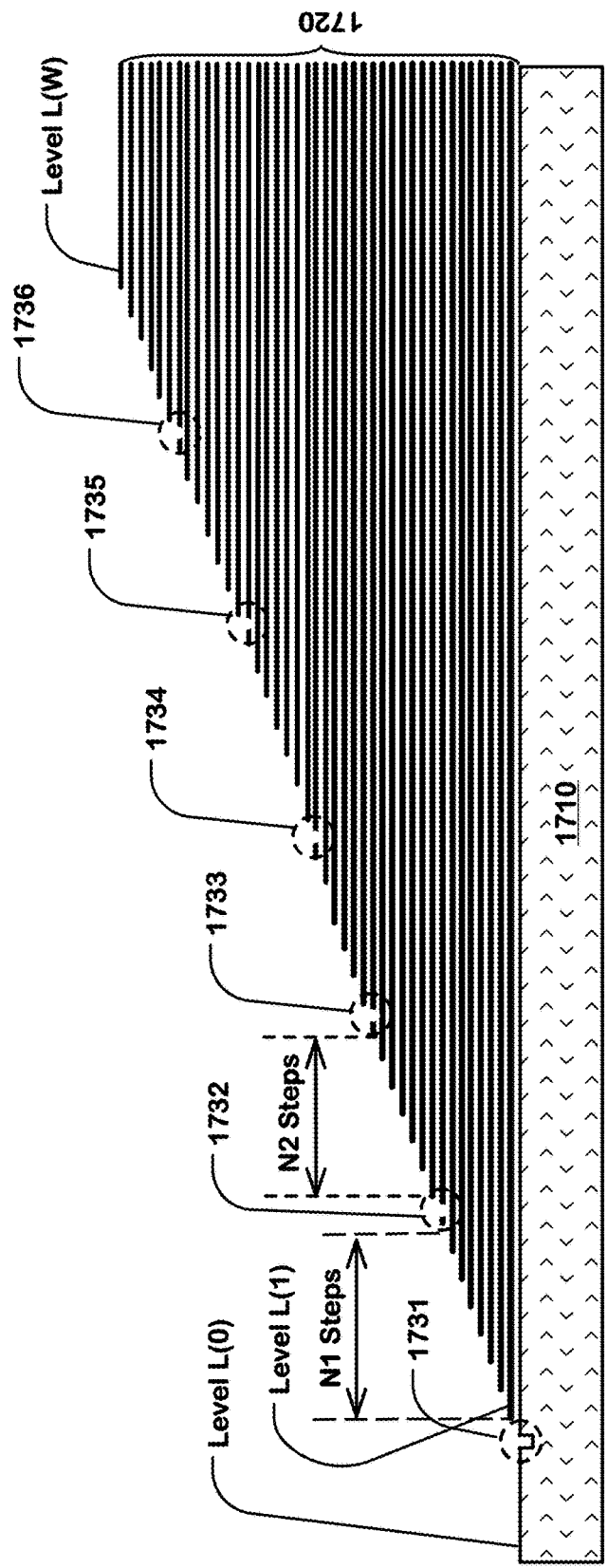

The etch-trim process described herein, including the process steps described in connection to FIGS. 17-23, can be repeated for more etch-trim cycles using more etch-trim masks using more reference marks, until all steps are formed at levels in the set of levels, as shown in FIG. 23. Further process steps can be performed on the device structure shown in FIG. 23 in manufacturing a 3D memory device.

FIG. 23 illustrates a device structure, formed in accordance with the methods described herein. The structure includes a set of levels 1720 on a substrate 1710, the set of levels including W levels L(i) for i going from 0 to W. The set of levels includes at least a first subset of levels L(i) for i going from 0 to N1, a first reference mark 1731 being disposed in a level L(0) in the first subset. A distance between the first reference mark in the level L(0) in the first subset and a first boundary of a level L(1) in the first subset is within a margin of a first target distance. A margin of a first target distance between a first reference mark in the level L(0) in the first subset and a first boundary of a level L(1) in the first subset (e.g. L(0) and L(1), FIG. 23), and a margin of a target distance between a first reference mark (e.g. 1731, FIG. 18) on a top level of a set of levels (e.g. 1720) and a first boundary (e.g. 1845, FIG. 18) of a first etch-trim mask (e.g. 1840, FIG. 18) can be different and have different values.

The set of levels includes a second subset of levels L(i) for i going from N1+1 to N1+1+N2, a second reference mark 1732 being disposed in a level L(N1+1) in the second subset. A second distance between the second reference mark in the level L(N1+1) and a second boundary of the level L(N1+2) in the second subset is within a margin of a second target distance.

The second target distance can be different than the first target distance. The first subset of the set of levels has a first number of levels, the second subset of the set of levels has a second number of levels, and the first number of levels can be different than the second number of levels. In one embodiment, each level in the set of levels L(i) for i going from 1 to W can include a layer of sacrificial material and a layer of insulating material.

FIGS. 24A, 24B, 24C and 24D are simplified drawings used to describe basic steps used in an etch-trim cycle as can be used in examples of the technology described herein. The figures show a multilevel circuit structure on an integrated circuit including a stack 10 of sacrificial layers 12 interleaved with dielectric layers 14. The specific sacrificial layers and dielectric layers are identified as sacrificial layers 12.1, 12.2, 12.3 and as dielectric layers 14.1, 14.2, 14.3. In this example, each level includes a sacrificial layer (e.g. 12.2) and a dielectric layer (e.g. 14.2) that underlies the sacrificial layer. In alternative embodiments, each level includes a dielectric layer and a sacrificial layer that underlies the dielectric layer. In such alternatives, the etching chemistry is chosen to stop on the dielectric layer in each level, rather than on the sacrificial layer.

Figure 24:
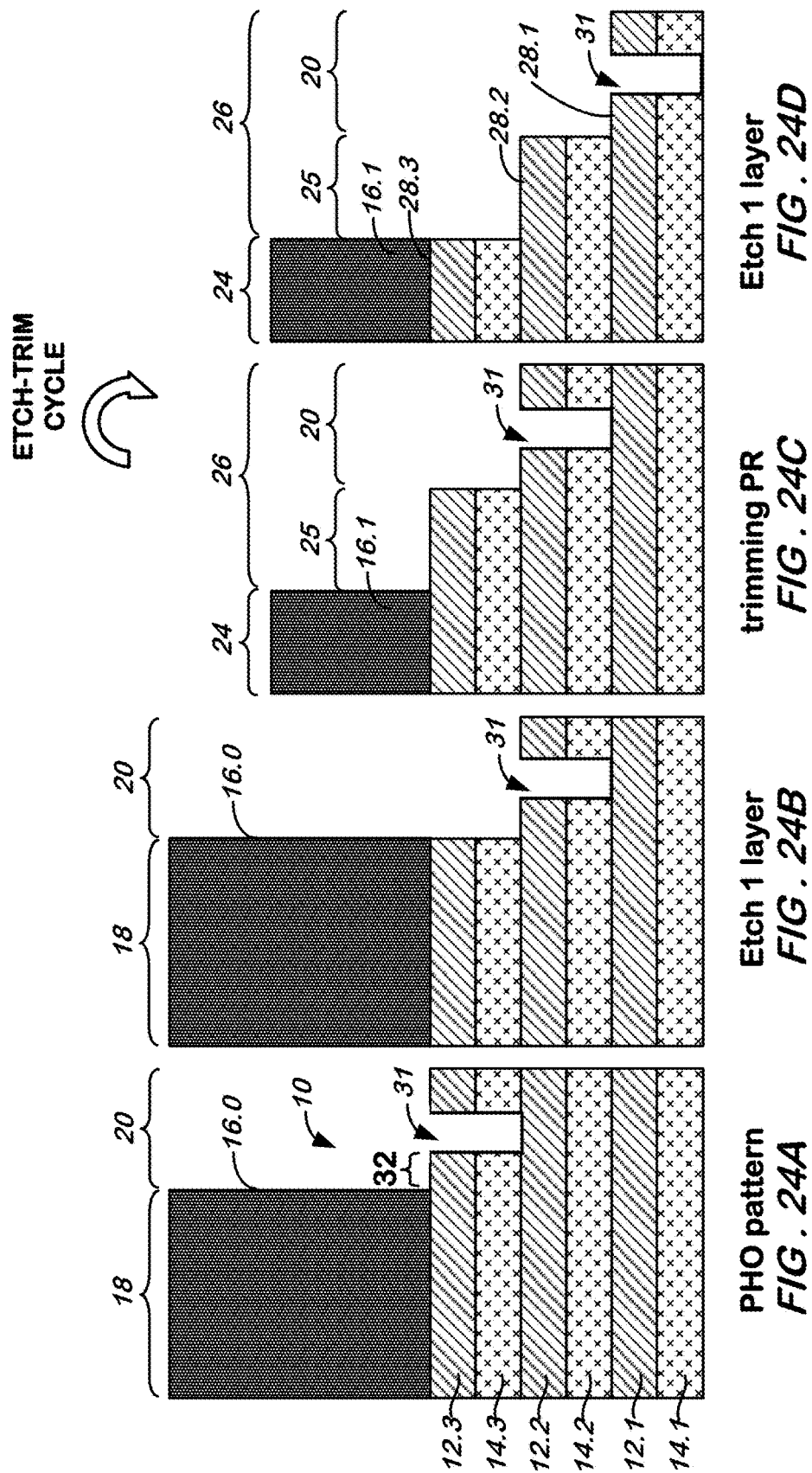
FIGS. 24A, 24B, 24C and 24D are a set of simplified drawings illustrating an etch-trim cycle in accordance with the present technology, in which a stack of conductive layers are separated by dielectric layers, etching one level, trimming the etch mask, and etching one level to create the structure of FIG. 24D.

The etching of stack 10 of sacrificial layers 12 and dielectric layers 14 exposes landing areas 28.1, 28.2, 28.3 using an etch-trim mask. FIG. 24A shows the etch-trim mask 16.0 including a mask region 18 and an open etch region 20. With etch-trim mask 16.0, one level is etched using the first etch mask. A reference mark (e.g. 31) is formed on a top level including a sacrificial layer (e.g. 12.3) and a dielectric layer (e.g. 14.3) in a set of levels. A distance (e.g. 32) between the reference mark and a boundary of the etch-trim mask 16.0 is inside a margin of a first target distance. FIG. 24B shows the result of etching one level through top sacrificial layer 12.3 and dielectric layer 14.3 at the open etch region 20 stopping at second sacrificial layer 12.2, resulting in transferring the reference mark 31 to a level below including a sacrificial layer (e.g. 12.2) and a dielectric layer (e.g. 14.2) in the set of levels. FIG. 24C shows the result of trimming the first etch-trim mask 16.0 of FIG. 24B creating a trimmed first etch-trim mask 16.1 having a trimmed mask region 24, a new open etch region 25, and an expanded open etch region 26, region 26 being equal to region 20 plus region 25. FIG. 24D shows the result of etching one level of the structure of FIG. 3C at expanded open etch region 26, resulting in transferring the reference mark 31 to a level below including a sacrificial layer (e.g. 12.1) and a dielectric layer (e.g. 14.1) in the set of levels. The resulting structure has exposed sacrificial landing areas 28.1, 28.2 and 28.3. Area 28.3 is considered exposed because it will be exposed upon removal of the trimmed first etch-trim mask 16.1. The resulting structure includes a reference mark (e.g. 31) disposed at a bottom level of stack 10.

FIGS. 24A, 24B, 24C and 24D show a two-step etch-trim cycle for forming a stairstep structure having sequential landing areas on three levels. As described herein, one etch-trim cycle using a single starting mask (e.g. mask 16.0) can be used to form more than two steps, including for example 4, 5, 6, 8 or any number of steps.

In order to use one etch-trim cycle to form a larger number of steps, the starting mask must be thicker to accommodate the erosion of the mask during each of the trim cycles. In order to use a thicker mask, in some technologies the dimensions of the contact regions must be relatively large to maintain enough margin for the lithographic steps.

Also, an etch-trim process including multiple etch-trim cycles can be used to form a larger number of steps using one starting mask per cycle. For example, one starting mask can be used to form eight steps with seven trim cycles, and a second starting mask can be used to form eight additional steps for a total of 16 stairsteps arranged sequentially.

The etch-trim masks 16.0 and 16.1 can be implemented using photoresist. Trimming processes for a photoresist mask are normally isotropic or multi-directional. This results in loss of the photoresist mask in the X, Y and Z directions. The loss in the Z direction can limit the number of levels to be etched in a given etch-trim cycle.

Figure 25:
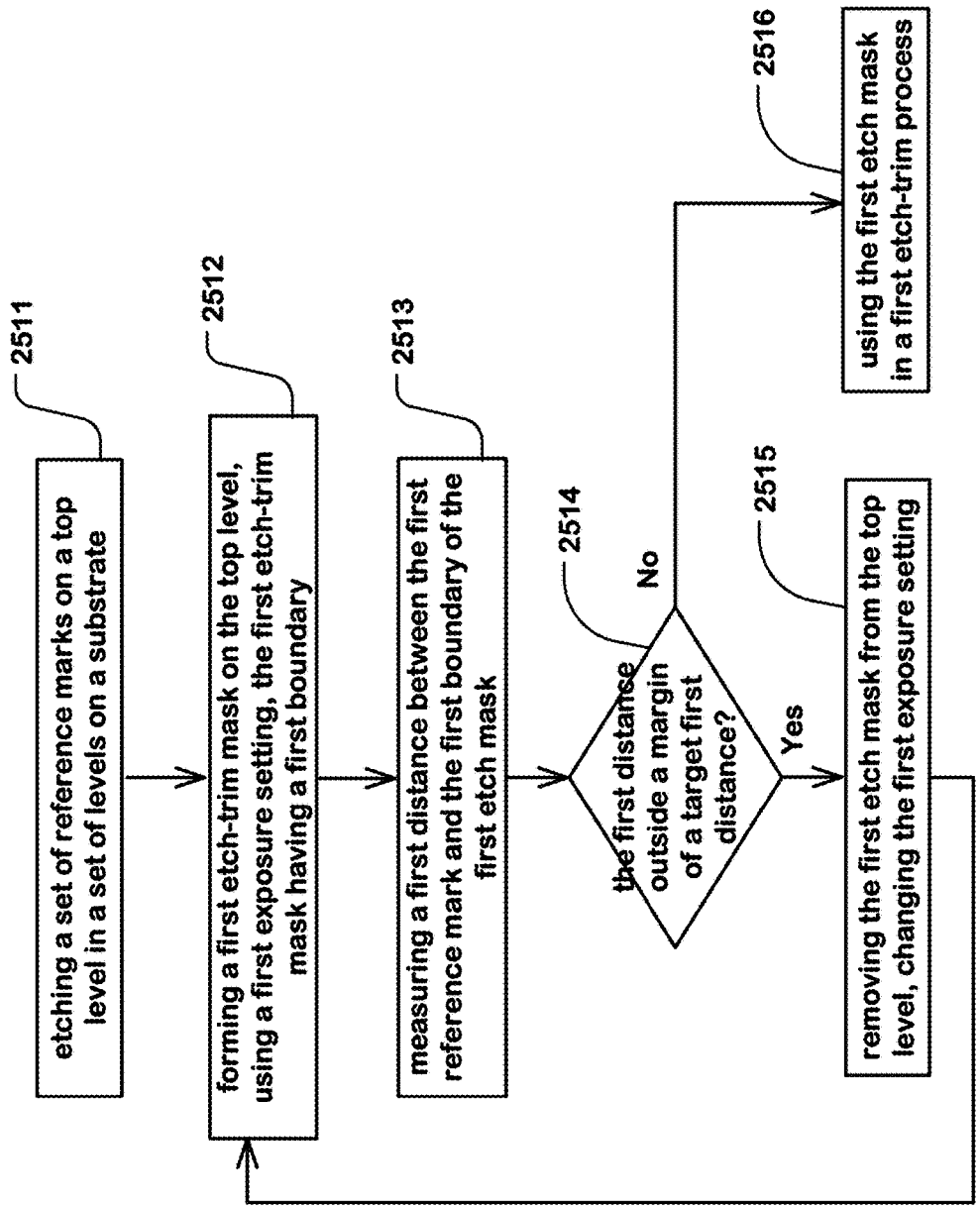
FIG. 25 illustrates a simplified flowchart of process steps used in forming aligned masks on a top level in a set of levels on a substrate.

FIG. 25 illustrates a simplified flowchart of process steps used in forming aligned masks on a top level in a set of levels on a substrate. At Step 2511, reference marks in a set of reference marks are etched on a substrate to demarcate boundaries of etch regions, as described in connection to FIG. 17. At Step 2512, a first etch-trim mask is formed on the top level, using a first exposure setting, where the first etch-trim mask has a first boundary, as described in connection to FIG. 18.

At Step 2513, a first distance is measured between the first reference mark and the first boundary of the first etch mask, for example, using an inline SEM. At Step 2514, it is determined whether the measured first distance is outside or inside a margin of a first target distance. At Step 2515, when the measured first distance is outside a margin of a first target distance, then the first etch mask can be removed from the substrate, the first exposure setting can be changed, a next first etch mask can be formed using the changed first exposure setting (Step 2512), and the measuring step 2513 can be repeated.

At Step 2516, when the first measured distance is inside the margin of the first target distance, then the first etch mask can be used in a first etch-trim process to form a subset of N1 steps, as described in connection to FIG. 19.

When the subset of N1 steps are formed, a second etch-trim mask can be formed on the top level, using a second exposure setting, where the second etch-trim mask has a second boundary, as described in connection to FIG. 20. A second distance is measured between the second reference mark and the second boundary of the second etch mask.

When the measured second distance is outside a margin of a second target distance, then the second etch mask can be removed from the substrate, the second exposure setting can be changed, a next second etch mask can be formed using the changed second exposure setting, and the measuring step on the second distance can be repeated. When the second measured distance is inside the margin of the second target distance, then the second etch mask can be used in a second etch-trim process, as described in connection to FIG. 21.

Process steps as described in forming aligned masks can continue in a similar fashion to form all aligned masks needed to form steps at the levels in the set of levels. After the steps have been formed at the levels in the set of levels, the sacrificial material in the set of levels can be replaced with a conductive material, so that each level in the set of levels includes a layer of conductive material and a layer of insulating material.

Figure 26:
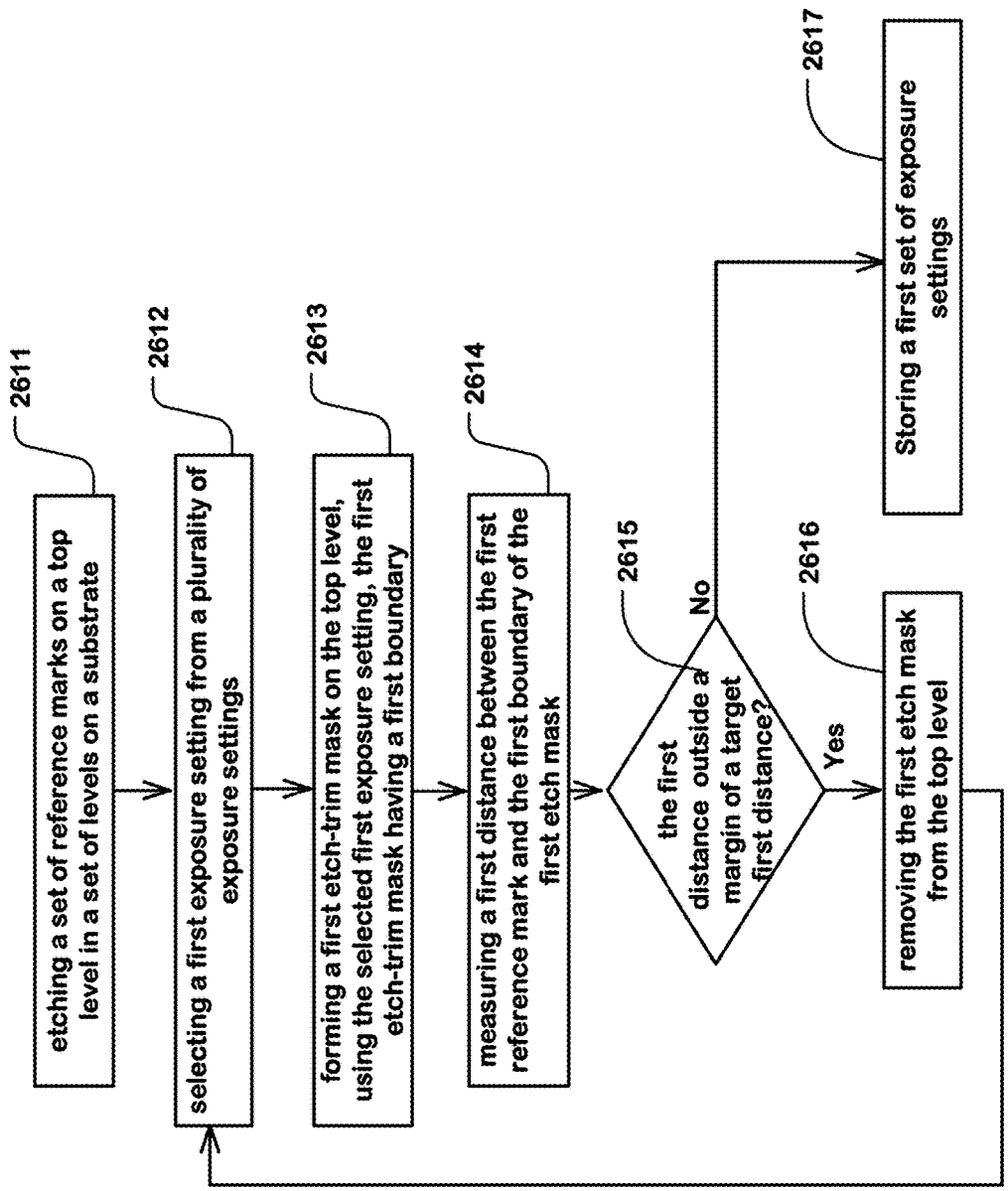
FIG. 26 illustrates a simplified flowchart of process steps used in calibrating the exposure settings for use with forming aligned masks on a top level in a set of levels.

FIG. 26 illustrates a simplified flowchart of process steps used in calibrating the exposure settings for use with forming aligned masks on a top level in a set of levels on a substrate as described in connection to FIGS. 17-23. In one embodiment, each level in the set of levels can include a layer of sacrificial material (e.g. SiN) and a layer of insulating material. At Step 2611, reference marks in a set of reference marks are etched on a substrate to demarcate boundaries of etch regions, such as described in connection to FIG. 17.

At Step 2612, a first exposure setting is selected from a plurality of exposure settings, such as illustrated by a matrix of exposure energy and focus center in FIG. 12. At Step 2613, a first etch-trim mask is formed on the top level, using the selected first exposure setting. The first etch-trim mask has a first boundary, such as described in connection to FIG. 18.

At Step 2614, a first distance is measured between the first reference mark and the first boundary of the first etch mask, for example, using an inline SEM. At Step 2615, it is determined whether the measured first distance is outside or inside a margin of a first target distance. At Step 2616, when the measured first distance is outside a margin of a first target distance, then the first etch mask can be removed from the substrate. Subsequently, a different first exposure setting can be selected from the plurality of exposure settings (Step 2612), and a next first etch mask can be formed using the changed first exposure setting (Step 2613), and the measuring step 2614 can be repeated (Step 2614).

At Step 2617, when the first measured distance is inside the margin of the first target distance, then a set of first exposure settings from the calibration can be stored, so first exposure settings from the calibration set can be selected for use with process steps in forming an aligned mask in production of multiple chips on one or more wafers. For instance, one first exposure setting from the calibration set may result in moving the first boundary of the first etch mask in a direction to increase a first distance between the first reference mark and the first boundary, while another first exposure setting from the calibration set may result in moving the first boundary of the first etch mask in another direction to decrease a first distance between the first reference mark and the first boundary.

The first calibration set can include a particular first exposure setting that results in the measured first distance being inside the margin. This particular first exposure setting can be stored as an optimal first exposure setting, and used as a first selection with process steps in forming aligned masks on a set of levels on a substrate in production of multiple chips on one or more wafers. For each exposure setting in the first calibration set, the parameters stored can include exposure energy, focus center, and a corresponding first distance between a first reference mark in the set of reference marks and a first boundary of an first etch mask. When the first measured distance is inside the margin of the first target distance, then the first etch mask can be used in a first etch-trim process to form a subset of N1 steps, such as described in connection to FIG. 19.

When the subset of N1 steps are formed, a second etch-trim mask can be formed on the top level, using a second exposure setting selected from a second plurality of exposure settings. The second etch-trim mask has a second boundary, such as described in connection to FIG. 20. A second distance can be measured between the second reference mark and the second boundary of the second etch mask.

Process steps as described in calibrating the exposure settings can continue in a similar fashion to determine the exposure settings for forming all aligned masks needed to form steps at the levels in the set of levels.

Figure 27A:
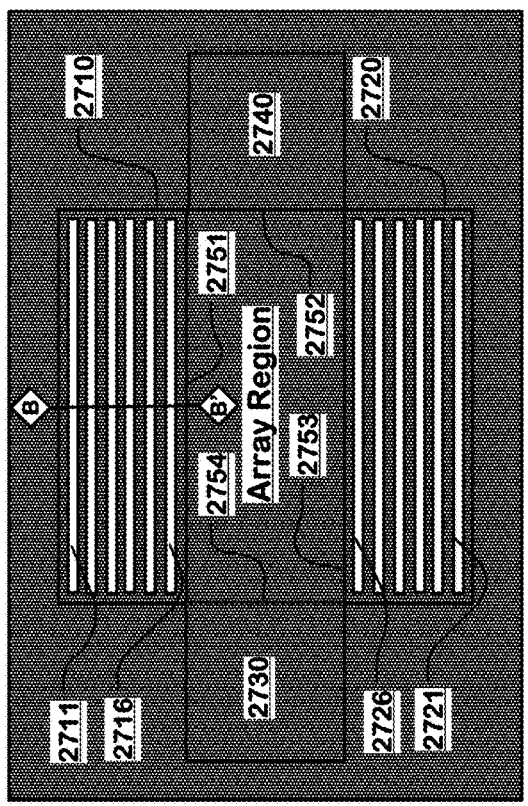
FIGS. 27A, 27B, 27C and 27D illustrate lithographic mask patterns for a set of reference marks in a reference mark etch mask on a top level in a set of levels.

FIGS. 27A, 27B, 27C and 27D illustrate lithographic mask patterns for a set of reference marks in a reference mark etch mask on a top level in a set of levels. The reference mark etch mask can be formed using one of the mask patterns, used to etch the set of reference marks, and then removed before any etch-trim mask (e.g. 1840, FIG. 18) is formed on the top level. FIG. 27A illustrates a mask pattern including reference marks in a first reference mark region 2710 and a second reference mark region 2720 opposite the first reference mark region across an array region for forming a memory array. The reference marks in each of the first and second reference mark regions have substantially the same lengths. As used herein, the term "substantially" is intended to accommodate manufacturing tolerances.

A cross sectional view taken along a line B-B' in FIG. 27A can be illustrated by FIG. 17. In the example of FIG. 27A, the 6 reference marks in each of the first and second reference mark regions can correspond to the 6 reference marks shown in FIG. 17. In the first reference mark region, a first reference mark 2711 can correspond to the reference mark 1731 shown in FIG. 17, and a sixth reference mark 2716 can correspond to the reference mark 1736 shown in FIG. 17. In the second reference mark region, a first reference mark 2721 can correspond to the reference mark 1731 shown in FIG. 17, and a sixth reference mark 2726 can correspond to the reference mark 1736 shown in FIG. 17.

The array region has sides including first sides (e.g. 2751, 2753) and second sides (e.g. 2752, 2754) oriented transversely to one another. In one embodiment, the first and second reference mark regions (e.g. 2710, 2720) are disposed on the first sides, while contact landing regions (e.g. 2730, 2740) are disposed on the second sides. Reference marks can be disposed in the first and second reference mark regions, but not in the contact landing regions. Contacts can land in the contact landing regions, but not in the first and second reference mark regions.

Figure 27B:
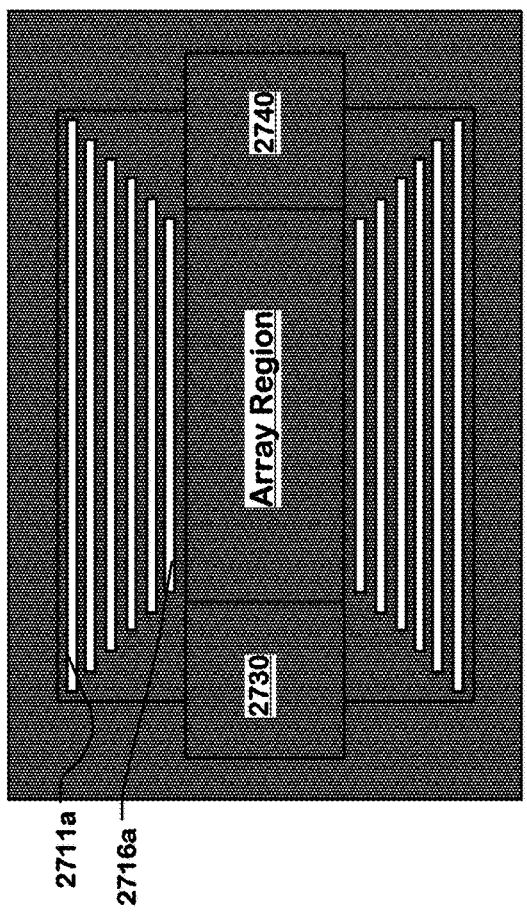

FIG. 27B illustrates a mask pattern similar to the mask pattern shown in FIG. 27A. A difference is that the reference marks in each of the first and second reference mark regions have different lengths. In one embodiment, the reference marks in each of the first and second reference mark regions have shorter lengths closer to the array region (e.g. 2716a) than the reference marks farther from the array region (e.g. 2711a).

Figure 27C:
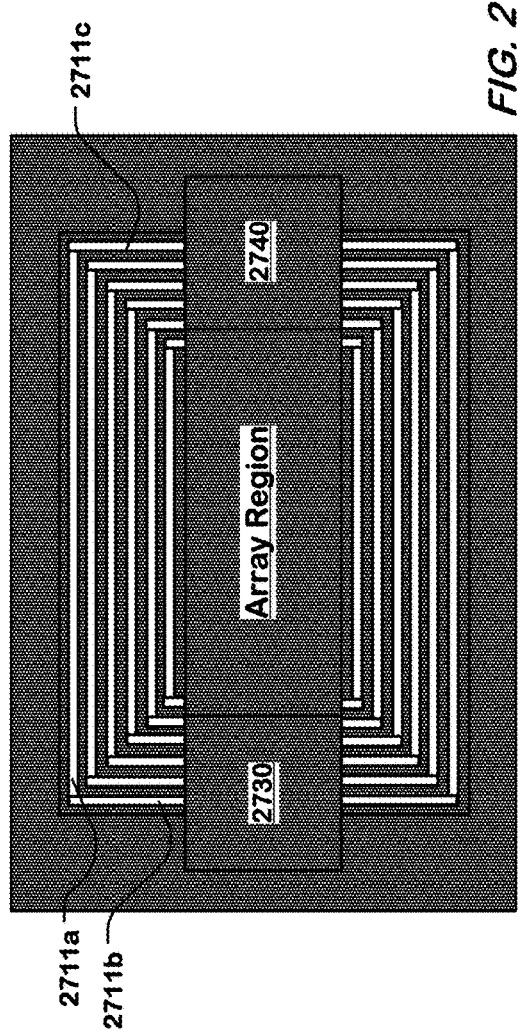

FIG. 27C illustrates a mask pattern similar to the mask pattern shown in FIG. 27B. A difference is that a reference mark in each of the first and second reference mark regions can have a first segment (e.g. 2711a) oriented in a first direction, and second and third segments (e.g. 2711b, 2711c) connected to the first segment and oriented in a second direction orthogonal to the first direction.

Figure 27D:
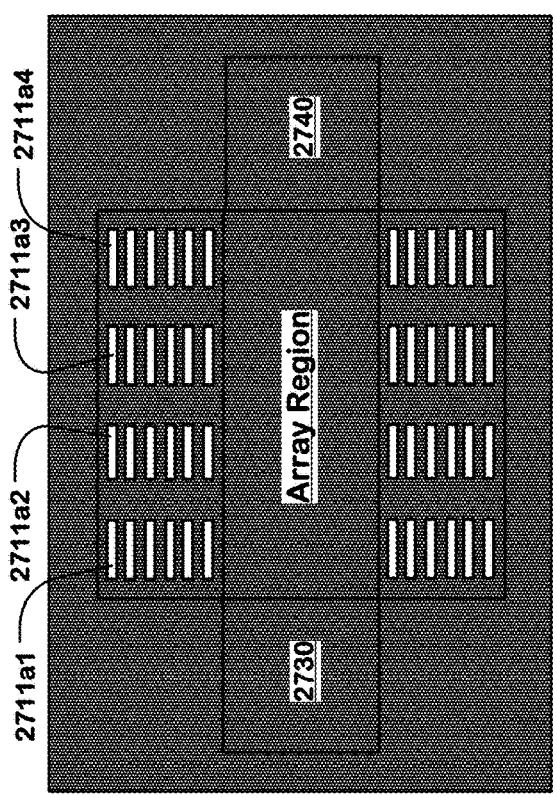

FIG. 27D illustrates a mask pattern similar to the mask pattern shown in FIG. 27A. A difference is that a reference mark in each of the first and second reference mark regions can comprise discontinuous segments (e.g. 2711a1, 2711a2, 2711a3, 2711a4) oriented in a same direction.

While the present technology is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the technology and the scope of the following claims. The disclosures of any and all patents, patent applications and printed publications referred to above are incorporated by reference.

What is claimed is:

1. A device comprising:
a substrate comprising a recess extending into the substrate;
a reference mark extending into a bottom of the recess, a distance between the reference mark and a side of the recess being within a margin of a target distance between the reference mark on the bottom of the recess and the side of the recess, the margin of the target distance being less than 10% of the target distance; and
a memory array disposed in the recess.

2. The device of claim 1, wherein the recess has a dimension between two opposite boundaries of the recess between 500 micrometers and 10,000 micrometers, and the target distance is between 100 nanometers and 1,000 nanometers.

3. The device of claim 1, the reference mark being disposed parallel to the side of the recess, and filled with insulating material.

4. The device of claim 1, wherein the reference mark on the bottom of the recess is transferred from an etch reference mark in an etch process, the etch reference mark penetrating through an upper surface of the substrate and into the substrate, the etch process etching the recess extending into the substrate, resulting in transferring the etch reference mark to the bottom of the recess.

5. A device, comprising:
a stairstep structure on a substrate, the stairstep structure including W levels L(i) for i going from 0 to W; and
the stairstep structure including at least a first sub-stairstep structure of levels L(i) for i going from 0 to N1, a first reference mark being disposed in a level L(0) in the first sub-stairstep structure, and a distance between the first reference mark in the level L(0) in the first sub-stairstep structure and a first boundary of a level L(1) in the first sub-stairstep structure being within a margin of a first target distance between the first reference mark on the substrate and the first boundary of the level L(1) in the first sub-stairstep structure, the margin of the first target distance being less than 10% of the first target distance,
wherein each of the levels in the levels L(i) for i going from 1 to W includes a layer of conductive material and a layer of insulating material.

6. The device of claim 5, the stairstep structure including a second sub-stairstep structure of levels L(i) for i going from N1+1 to N1+1+N2, a second reference mark being disposed in a level L(N1+1) in the second sub-stairstep structure, and a second distance between the second reference mark in the level L(N1+1) and a second boundary of the level L(N1+2) in the second sub-stairstep structure being within a margin of a second target distance between the second reference mark in the level L(N1+1) and the second boundary of the level L(N1+2) in the second sub-stairstep structure, the margin of the second target distance being less than 10% of the second target distance,
wherein the second target distance is different than the first target distance.

7. The device of claim 6, wherein the first sub-stairstep structure of the stairstep structure has a first number of levels, the second sub-stairstep structure of the stairstep structure has a second number of levels, and the first number of levels is different than the second number of levels.

* * * * *